United States Patent
Sasagawa et al.

(10) Patent No.: US 8,932,913 B2
(45) Date of Patent: Jan. 13, 2015

(54) MANUFACTURING METHOD OF SEMICONDUCTOR DEVICE

(75) Inventors: Shinya Sasagawa, Chigasaki (JP); Akihiro Ishizuka, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 116 days.

(21) Appl. No.: 13/446,022

(22) Filed: Apr. 13, 2012

(65) Prior Publication Data

US 2012/0270375 A1     Oct. 25, 2012

(30) Foreign Application Priority Data

Apr. 22, 2011 (JP) ................................ 2011-096162

(51) Int. Cl.
| | |
|---|---|
| H01L 21/00 | (2006.01) |
| H01L 21/84 | (2006.01) |
| H01L 29/423 | (2006.01) |
| H01L 29/78 | (2006.01) |
| H01L 29/786 | (2006.01) |

(52) U.S. Cl.
CPC .......... *H01L 29/4236* (2013.01); *H01L 29/785* (2013.01); *H01L 29/7869* (2013.01); *H01L 29/42384* (2013.01); *H01L 29/78603* (2013.01); *H01L 29/78696* (2013.01)
USPC ..................... 438/149; 438/163; 257/E51.006

(58) Field of Classification Search
None
See application file for complete search history.

(56) References Cited

U.S. PATENT DOCUMENTS

| | | |
|---|---|---|
| 5,229,310 A | 7/1993 | Sivan |
| 5,731,856 A | 3/1998 | Kim et al. |
| 5,733,810 A | 3/1998 | Baba et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Wensing Kuo
*Assistant Examiner* — Shaka White
(74) *Attorney, Agent, or Firm* — Eric J. Robinson; Robinson Intellectual Property Law Office, P.C.

(57) ABSTRACT

To provide a semiconductor device which prevents defects and achieves miniaturization. A projecting portion or a trench (a groove portion) is formed in an insulating layer and a channel formation region of a semiconductor layer is provided in contact with the projecting portion or the trench, so that the channel formation region is extended in a direction perpendicular to a substrate. Thus, miniaturization of the transistor can be achieved and an effective channel length can be extended. In addition, before formation of the semiconductor layer, an upper-end corner portion of the projecting portion or the trench with which the semiconductor layer is in contact is subjected to round chamfering, so that a thin semiconductor layer can be formed with good coverage.

16 Claims, 12 Drawing Sheets

(56) References Cited

U.S. PATENT DOCUMENTS

| | | | |
|---|---|---|---|
| 5,843,846 A * | 12/1998 | Nguyen et al. | 438/713 |
| 6,001,734 A * | 12/1999 | Drynan | 438/637 |
| 6,107,662 A | 8/2000 | Kim | |
| 6,235,570 B1 | 5/2001 | Kang | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,841,797 B2 | 1/2005 | Isobe et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,439,545 B2 | 10/2008 | Honda | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,463,399 B2 | 12/2008 | Shin et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,777,414 B2 | 8/2010 | Honda | |
| 8,034,674 B2 | 10/2011 | Nagai et al. | |
| 8,188,472 B2 | 5/2012 | Park et al. | |
| 8,202,365 B2 | 6/2012 | Umeda et al. | |
| 8,247,813 B2 | 8/2012 | Koyama et al. | |
| 8,274,078 B2 | 9/2012 | Itagaki et al. | |
| 8,293,661 B2 | 10/2012 | Yamazaki | |
| 8,324,621 B2 | 12/2012 | Yamazaki et al. | |
| 8,367,489 B2 | 2/2013 | Yamazaki | |
| 8,377,744 B2 | 2/2013 | Yamazaki et al. | |
| 8,492,758 B2 | 7/2013 | Yamazaki et al. | |
| 8,530,285 B2 | 9/2013 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0170955 A1 | 9/2003 | Kawamura et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0248387 A1 * | 12/2004 | Kawasaki et al. | 438/479 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 * | 5/2006 | Yabuta et al. | 438/151 |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0023698 A1 * | 1/2008 | Li et al. | 257/43 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0057649 A1 * | 3/2008 | Schuele et al. | 438/270 |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0121877 A1 | 5/2008 | Ender et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0220620 A1 | 9/2008 | Kawada et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0001436 A1 | 1/2009 | Kondo | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0127552 A1 | 5/2009 | Li et al. | |
| 2009/0134399 A1 | 5/2009 | Sakakura et al. | |
| 2009/0146261 A1 * | 6/2009 | Onodera et al. | 257/621 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0286351 A1 | 11/2009 | Hirao et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0320458 A1 | 12/2010 | Umeda et al. | |
| 2010/0320459 A1 | 12/2010 | Umeda et al. | |
| 2011/0062436 A1 | 3/2011 | Yamazaki et al. | |
| 2011/0108837 A1 | 5/2011 | Yamazaki et al. | |
| 2011/0127521 A1 | 6/2011 | Yamazaki | |
| 2011/0127523 A1 | 6/2011 | Yamazaki | |
| 2011/0127579 A1 | 6/2011 | Yamazaki | |
| 2011/0133191 A1 | 6/2011 | Yamazaki | |
| 2011/0147739 A1 | 6/2011 | Yamazaki et al. | |
| 2011/0151618 A1 | 6/2011 | Yamazaki et al. | |
| 2011/0284848 A1 | 11/2011 | Yamazaki | |
| 2012/0052606 A1 | 3/2012 | Yamazaki | |
| 2012/0061663 A1 | 3/2012 | Yamazaki et al. | |
| 2012/0064664 A1 | 3/2012 | Yamazaki et al. | |
| 2012/0064703 A1 | 3/2012 | Jintyou et al. | |
| 2012/0187410 A1 | 7/2012 | Yamazaki et al. | |
| 2012/0187417 A1 | 7/2012 | Yamazaki et al. | |
| 2012/0187475 A1 | 7/2012 | Yamazaki et al. | |
| 2012/0267623 A1 | 10/2012 | Isobe et al. | |
| 2012/0267624 A1 | 10/2012 | Isobe et al. | |
| 2012/0267696 A1 | 10/2012 | Isobe et al. | |
| 2012/0267709 A1 | 10/2012 | Isobe et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| WO | WO-2004/114391 | 12/2004 |
| WO | WO-2008/133345 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest'04 : SID International Symposium Digest of Technical Papers, 2004, vol. 35, pp. 860-863.

Nomura.K et al., "Room-Temperature Fabrication of Transparent Flexible Thin-Film Transistors Using Amorphorous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphorous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 :SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000°C. ,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-05501-4.

Park.J et al., "Dry etching of ZnO films and plasma-induced damage to optical properties,", J. Vac. Sci. Technol. B. (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

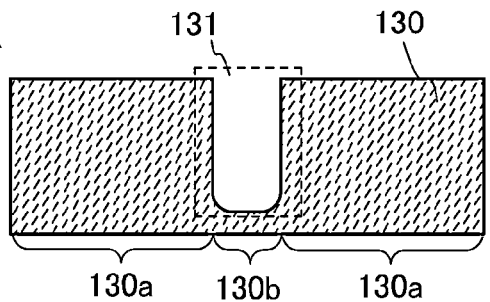
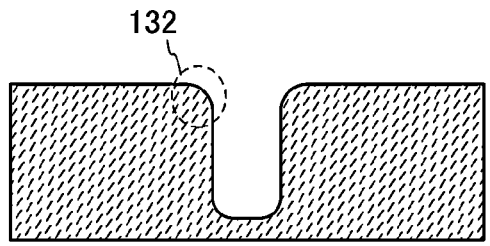
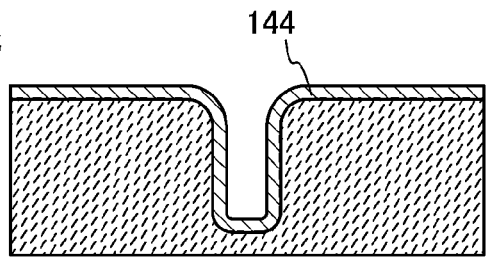
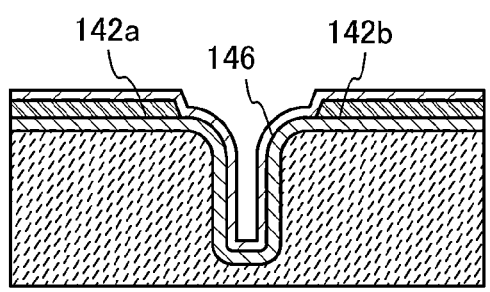
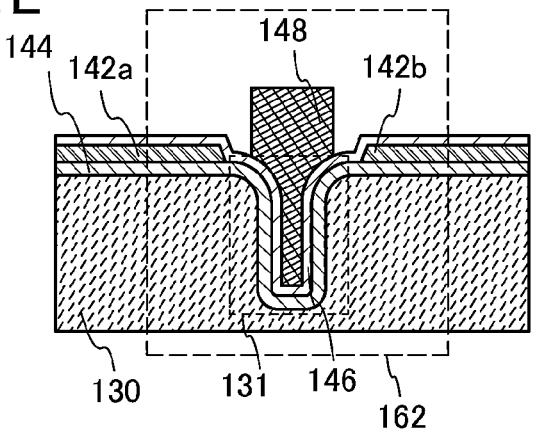

MANUFACTURING METHOD OF SEMICONDUCTOR DEVICE

BACKGROUND OF THE INVENTION

1. Field of the Invention

The invention disclosed in this specification relates to a method for manufacturing a semiconductor device utilizing a semiconductor element.

2. Description of the Related Art

A technique by which transistors are formed using semiconductor thin films formed over a substrate having an insulating surface has attracted attention. Such transistors are applied to a wide range of electronic devices such as an integrated circuit (IC) and an image display device (display device). A technique by which a wide-gap semiconductor such as an oxide semiconductor is used for a semiconductor thin film which can be applied to a transistor has attracted attention.

For example, in Patent Document 1, it has been confirmed that an oxide semiconductor containing an In—Ga—Zn-based oxide is applicable to a channel formation region of a thin film transistor.

Reference

[Patent Document 1] Japanese Published Patent Application No. 2004-103957

SUMMARY OF THE INVENTION

In order to achieve high-speed operation, low power consumption, high integration, cost reduction, or the like of a transistor, it is necessary to miniaturize a transistor.

In the case where a transistor is miniaturized, a defect in a manufacturing process is a major problem. For example, a source electrode and a drain electrode are electrically connected to a channel formation region; however, a disconnection, a defective connection, or the like may occur due to a decrease in coverage by the miniaturization.

In addition, in the case where a transistor is miniaturized, a problem of a short-channel effect is also caused. The short-channel effect refers to degradation of electric characteristics which becomes obvious with miniaturization of a transistor (a reduction in channel length (L)). The short-channel effect results from the effect of an electric field of a drain on a source. Specific examples of the short-channel effect are a decrease in threshold voltage, an increase in subthreshold swing (S value), an increase in leakage current, and the like. In particular, the threshold voltage of a transistor including silicon is controlled by doping, but the threshold voltage of a transistor including a wide-gap semiconductor such as an oxide semiconductor is difficult to be controlled by doping; therefore, a short-channel effect tends to be caused easily.

In view of these problems, it is an object of one embodiment of the disclosed invention to provide a method for manufacturing a semiconductor device which prevents defects and achieves miniaturization.

According to the disclosed invention, a projecting portion or a trench (a groove portion) is formed in an insulating layer and a channel formation region of a semiconductor layer is provided in contact with the projecting portion or the trench, so that the channel formation region is extended in a direction perpendicular to a substrate. Thus, miniaturization of the transistor can be achieved and an effective channel length can be extended. In addition, before formation of the semiconductor layer, an upper-end corner portion of the projecting portion or the trench with which the semiconductor layer is in contact is subjected to round chamfering, so that a thin semiconductor layer can be formed with good coverage. More specifically, the following manufacturing method can be employed.

According to one embodiment of the present invention, a method for manufacturing a semiconductor device includes the steps of: forming an insulating layer; etching the insulating layer to form a region having a curved surface with a radius of curvature of greater than or equal to 20 nm and less than or equal to 60 nm; forming a wide-gap semiconductor layer over the insulating layer so as to be in contact with at least the region having the curved surface; forming a source electrode and a drain electrode electrically connected to the wide-gap semiconductor layer; forming a gate insulating layer over the wide-gap semiconductor layer; and forming a gate electrode over the gate insulating layer.

According to another embodiment of the present invention, a method for manufacturing a semiconductor device includes the steps of: forming an insulating layer; etching the insulating layer to form a first region with a first thickness and a second region with a second thickness smaller than the first thickness; processing an upper-end corner portion of the first region into a curved shape with a radius of curvature of greater than or equal to 20 nm and less than or equal to 60 nm with rare gas plasma treatment; forming a wide-gap semiconductor layer in contact with the first region at least including the upper-end corner portion processed into the curved shape and with at least part of the second region; forming a source electrode and a drain electrode electrically connected to the wide-gap semiconductor layer; forming a gate insulating layer over the wide-gap semiconductor layer; and forming a gate electrode over the gate insulating layer.

According to another embodiment of the present invention, a method for manufacturing a semiconductor device includes the steps of: forming an insulating layer; forming a metal layer over the insulating layer; forming a resist mask over the metal layer; patterning the metal layer with the resist mask and then removing the resist mask; etching the insulating layer with the patterned metal layer to form a first region with a first thickness and a second region with a second thickness smaller than the first thickness; removing the patterned metal layer and processing an upper-end corner portion of the first region into a curved shape with a radius of curvature of greater than or equal to 20 nm and less than or equal to 60 nm, by performing dry etching on the patterned metal layer with one or both of a gas containing fluorine and a gas containing chlorine; forming a wide-gap semiconductor layer in contact with the first region at least including the upper-end corner portion processed into the curved shape and with at least part of the second region; forming a source electrode and a drain electrode electrically connected to the wide-gap semiconductor layer; forming a gate insulating layer over the wide-gap semiconductor layer; and forming a gate electrode over the gate insulating layer.

According to another embodiment of the present invention, a method for manufacturing a semiconductor device includes the steps of: forming an insulating layer; forming a resist mask over the insulating layer; performing heat treatment on the resist mask to obtain a resist mask having a curved surface; etching the insulating layer with the resist mask having the curved surface to form a first region with a first thickness and a second region with a second thickness smaller than the first thickness, the first region having an upper-end corner portion processed into a curved shape with a radius of curvature of greater than or equal to 20 nm and less than or equal to 60 nm; forming a wide-gap semiconductor layer in contact with the first region at least including the upper-end corner portion processed into the curved shape and with at least part of the second region; forming a source electrode and a drain electrode electrically connected to the wide-gap semiconductor layer; forming a gate insulating layer over the wide-gap semiconductor layer; and forming a gate electrode over the gate insulating layer.

In the above manufacturing method, the second region may be provided between a first region and another first region, which are apart from each other, to form a trench in the insulating layer, and the gate electrode may be formed to overlap with the trench.

In the above manufacturing method, the first region may be provided between a second region and another second region, which are apart from each other, to form a projecting portion in the insulating layer, and the gate electrode may be formed to overlap with the projecting portion.

In the above manufacturing method, an oxide semiconductor layer may be formed as the wide-gap semiconductor layer.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Note that functions of a "source" and a "drain" might interchange when a transistor of opposite polarity is used or the direction of current flow is changed in circuit operation, for example. Thus, in this specification, the terms "source" and "drain" can interchange.

Note that in this specification and the like, the expression "electrically connected" includes the case where components are connected to each other through an "object having any electric action". Here, there is no particular limitation on an "object having any electric action" as long as electric signals can be transmitted and received between components that are connected to each other.

Examples of an "object having any electric action" include a switching element such as a transistor, a resistor, an inductor, a capacitor, and an element with a variety of functions in addition to an electrode and a wiring.

In this specification and the like, average surface roughness ($R_a$) is obtained by three-dimensional expansion of arithmetic mean surface roughness ($R_a$) which is defined by JIS B 0601:2001 (ISO 4287:1997) so that $R_a$ can be applied to a curved surface, and is an average value of the absolute values of deviations from a reference surface to a specific surface.

Here, the arithmetic mean surface roughness ($R_a$) is shown by the following formula (1) assuming that a portion of a roughness curve is withdrawn in a length corresponding to an evaluation length $L_0$, the direction of the mean line of the roughness curve of the picked portion is represented by an x-axis, the direction of longitudinal magnification (direction perpendicular to the x-axis) is represented by a y-axis, and the roughness curve is expressed as y=f(x).

[FORMULA 1]

$$Ra = \frac{1}{L_0} \int_0^{L_0} |f(x)| dx \quad (1)$$

When a curved surface obtained by cutting off a long-wavelength component from a measured surface is expressed as $Z_0 = f(x, y)$, the average surface roughness ($R_a$) is an average value of the absolute values of deviations from the reference surface to the specific surface and is shown by the following formula (2).

[FORMULA 2]

$$Ra = \frac{1}{S_0} \int_{y_1}^{y_2} \int_{x_1}^{x_2} |f(x, y) - Z_0| dx dy \quad (2)$$

Here, the specific surface is a surface which is a target of roughness measurement, and is a quadrilateral region which is surrounded by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of the specific surface when the specific surface is flat ideally.

In addition, the reference surface is a surface parallel to an x-y plane at the average height of the specific surface. That is, when the average value of the height of the specific surface is expressed as $Z_0$, the height of the reference surface is also expressed as $Z_0$.

According to one embodiment of the disclosed invention, a method for manufacturing a semiconductor device which prevents defects and achieves miniaturization can be provided.

In addition, according to one embodiment of the disclosed invention, the size of a transistor can be sufficiently reduced. When the size of the transistor is sufficiently reduced, the size of a semiconductor device is also reduced and thus the number of semiconductor devices manufactured from one substrate is increased. Accordingly, manufacturing cost of the semiconductor device can be reduced. Further, since the semiconductor device is downsized, the semiconductor device which is substantially the same in size with further increased function can be realized. Alternatively, high integration of the semiconductor device can be achieved. Furthermore, effects of high-speed operation, low power consumption, and the like due to a miniaturization of the transistor can be obtained.

BRIEF DESCRIPTION OF THE DRAWINGS

In the accompanying drawings:

FIGS. 1A to 1E are cross-sectional views illustrating manufacturing steps of a semiconductor device;

DETAILED DESCRIPTION OF THE INVENTION

Figure 2A:
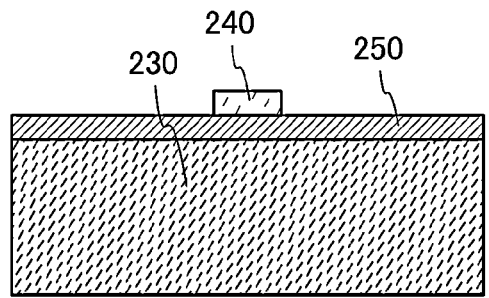
FIGS. 2A to 2F are cross-sectional views illustrating manufacturing steps of a semiconductor device.

Examples of embodiments of the present invention will be described below with reference to drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments. Note that in the following embodiments and examples, the same portions or portions having similar functions are denoted by the same reference numerals in different drawings, and explanation thereof will not be repeated.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that in this specification and the like, ordinal numbers such as "first", "second", and "third" are used in order to avoid confusion among components and do not limit the number.

(Embodiment 1)

In this embodiment, an example of a semiconductor device and a manufacturing process thereof according to one embodiment of the disclosed invention will be described with reference to FIGS. 1A to 1E.

In this embodiment, an example in which an oxide semiconductor is used as a wide-gap semiconductor which can be applied to a transistor is described. As an oxide semiconductor, an oxide semiconductor having a band gap larger than at least 1.1 eV, which is the band gap of silicon, can be applied; for example, an In—Ga—Zn—O-based oxide semiconductor having a band gap of 3.15 eV, indium oxide having a band gap of about 3.0 eV, indium tin oxide having a band gap of about 3.0 eV, indium gallium oxide having a band gap of about 3.3 eV, indium zinc oxide having a band gap of about 2.7 eV, tin oxide having a band gap of about 3.3 eV, zinc oxide having a band gap of about 3.37 eV, or the like can be preferably used. Note that the wide-gap semiconductor which can be applied to the semiconductor device of one embodiment of the present invention is not limited to the above oxide semiconductors. Alternatively, gallium nitride, gallium oxynitride, gallium zinc oxynitride, or the like may be used. With the use of such a material, the off-state current of the transistor can be kept extremely low.

A transistor 162 illustrated in FIG. 1E includes an insulating layer 130 provided with a trench 131, an oxide semiconductor layer 144 provided in contact with at least part of a top surface of the insulating layer 130 and with a bottom surface and an inner wall surface of the trench 131, a source electrode 142a and a drain electrode 142b electrically connected to the oxide semiconductor layer 144, a gate insulating layer 146 provided over the oxide semiconductor layer 144, and a gate electrode 148 provided over the gate insulating layer 146, which fills the trench 131.

In the transistor 162 illustrated in FIG. 1E, the oxide semiconductor layer 144 is provided so as to be in contact with the bottom surface and the inner wall surface of the trench 131 of the insulating layer 130. The cross-sectional shape of the oxide semiconductor layer 144 in the channel-length direction (the direction of carrier flow) is a shape curved along the cross-sectional shape of the trench 131. With this structure, as the trench 131 becomes deeper, an effective channel length of the transistor 162 can be increased.

Therefore, even when the distance between the source electrode 142a and the drain electrode 142b is shortened, the effective channel length can be kept by appropriately setting the depth of the trench 131; thus, the occurrence of the short-channel effect can be suppressed and reduction of the area of the transistor can be accomplished. Note that it is preferable that an upper surface shape of the trench 131 be a stripe shape which extends in the channel-width direction of the transistor 162 (the direction perpendicular to the direction of carrier flow).

In an upper-end corner portion of the trench 131 of the insulating layer 130, a region having a curved surface is formed by round chamfering. When the upper-end corner portion is a sharp corner portion, a defective shape or the like due to a decrease in coverage with the oxide semiconductor layer is caused, and there is a possibility that stable electric characteristics are hardly obtained. However, the oxide semiconductor layer 144 in this embodiment is provided in contact with at least the region having a curved surface; therefore, the coverage with the oxide semiconductor layer 144 is improved and a disconnection or a defective connection can be prevented in the upper-end corner portion of the trench 131.

The oxide semiconductor layer 144 included in the transistor 162 is preferably a highly purified oxide semiconductor layer by sufficiently removing impurities such as hydrogen or sufficiently supplying oxygen. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration of the oxide semiconductor layer 144 is measured by secondary ion mass spectrometry (SIMS). In the oxide semiconductor layer 144 which is highly purified by sufficiently reducing the hydrogen concentration and in which defect levels in an energy gap due to oxygen deficiency are reduced by supplying a sufficient amount of oxygen, the carrier concentration is lower than $1 \times 10^{12}$/cm$^3$, preferably lower than $1 \times 10^{11}$/cm$^3$, more preferably lower than $1.45 \times 10^{10}$/cm$^3$. For example, the off-state current (per unit channel width (1 μm) here) at room temperature (25° C.) can be reduced to a value lower than or equal to 100 zA (1 zA (zeptoampere) is $1 \times 10^{-21}$ A), preferably lower than or equal to 10 zA, more preferably lower than or equal to 1 zA, still more preferably lower than or equal to 100 yA (1 yA (yoctoampere) is $1 \times 10^{-24}$ A). In this manner, by using an oxide semiconductor which is made to be an i-type (intrinsic) oxide semiconductor or a substantially i-type oxide semiconductor, the transistor 162 which has extremely favorable off-state current characteristics can be obtained.

An example of a manufacturing process of the transistor 162 is described below.

First, the insulating layer 130 is formed over a substrate (not illustrated) containing a semiconductor material.

For the substrate containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. A semiconductor element may be formed over the substrate.

Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

The insulating layer 130 can be formed using a silicon oxide film, a gallium oxide film, an aluminum oxide film, a silicon oxynitride film, an aluminum oxynitride film, or the like.

Next, the trench 131 (also referred to as a groove) is formed in the insulating layer 130 (see FIG. 1A). The trench 131 can be formed, for example, in such a manner that a resist mask is formed over the insulating layer 130 by a photolithography process and the insulating layer 130 is etched using the resist mask.

For the etching of the insulating layer 130, for example, a dry etching method such as a reactive ion etching (RIE) method, an inductively coupled plasma (ICP) etching method, an electron cyclotron resonance (ECR) etching method, a parallel-plate (capacitively coupled) etching method, a magnetron plasma etching method, a dual-frequency plasma etching method, or a helicon wave plasma etching method can be used. A fluorocarbon-based gas such as trifluoromethane ($CHF_3$), carbon tetrafluoride ($CF_4$), or perfluorocyclobutane ($C_4F_8$), methane ($CH_4$), hydrogen, and a rare gas such as helium or argon can be appropriately mixed to be used as an etching gas.

In addition, the trench 131 is formed in a single etching step or through a plurality of etching steps. In the case of a plurality of etching steps, dry etching and wet etching may be used in combination.

By formation of the trench 131, a first region 130a with a first thickness and a second region 130b with a thickness smaller than the first thickness are formed in the insulating layer 130. In other words, the second region 130b is provided between a first region 130a and another first region 130a, so that a groove portion (trench 131) is formed.

Next, rare gas plasma treatment is performed on the insulating layer 130 including the trench 131. Through the rare gas plasma treatment, a corner portion (hereinafter also referred to as an upper-end corner portion of the first region 130a) formed by an upper surface of the first region 130a and the boundary surface between the first region 130a and the second region 130b is rounded (subjected to round chamfering), so that a region 132 having a curved surface is formed (see FIG. 1B). A rare gas element having large mass, such as argon, krypton, or xenon, is preferably used for the plasma treatment. Through the rare gas plasma treatment, the upper-end corner portion of the first region 130a is processed into a curved shape, preferably with a radius of curvature of greater than or equal to 20 nm and less than or equal to 60 nm.

Note that through the rare gas plasma treatment, an impurity such as oxygen, moisture, or an organic substance adhered to a surface of the insulating layer 130 can be removed by a sputtering effect. Further, the surface of the insulating layer 130 can be planarized. For example, the surface of the insulating layer 130 (including the region 132 having a curved surface) is planarized so that the surface roughness is reduced; the average surface roughness of the insulating layer 130 can be preferably greater than or equal to 0.1 nm and less than 0.5 nm.

Then, the oxide semiconductor layer 144 is formed in contact with the bottom surface and the inner wall surface of the trench 131 of the insulating layer 130 (see FIG. 1C). The oxide semiconductor layer 144 is provided in contact with the first region 130a including the region 132 having a curved surface and with at least part of the second region 130b. When the region 132 having a curved surface is included in the upper-end corner portion of the first region 130a of the insulating layer 130, the coverage with the oxide semiconductor layer 144 is improved and a disconnection or a defective connection can be prevented.

The oxide semiconductor layer 144 can have a thickness of 1 nm to 100 nm and can be formed by a sputtering method, a molecular beam epitaxy (MBE) method, a pulsed laser deposition method, an atomic layer deposition (ALD) method, or the like as appropriate. The oxide semiconductor layer 144 may be formed using a sputtering apparatus which performs film formation with surfaces of a plurality of substrates set substantially perpendicular to a surface of a sputtering target, which is so called a columnar plasma (CP) sputtering system.

As a material of the oxide semiconductor layer 144, an oxide semiconductor having a larger band gap than at least silicon is used. As an oxide semiconductor having a larger band gap than silicon, for example, a quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, or a Hf—In—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or a single metal oxide such as an In—O-based oxide semiconductor, a Sn—O-based oxide semiconductor, or a Zn—O-based oxide semiconductor can be used. In this embodiment, an In—Ga—Zn—O-based oxide semiconductor is used.

Note that for example, an In—Ga—Zn—O-based oxide semiconductor means an oxide semiconductor containing indium (In), gallium (Ga), and zinc (Zn), and there is no limitation on the composition thereof.

As the oxide semiconductor layer 144, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Sn—Zn—O-based oxide semiconductor is used as an oxide semiconductor, a ratio of atoms of the metal elements of the target is In:Sn:Zn=1:2:2, In:Sn:Zn=2:1:3, or In:Sn:Zn=1:1:1 in an atomic ratio, for example.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), more preferably, In:Zn=15:1 to 1.5:1 in an atomic ratio ($In_2O_3$:ZnO=15:2 to 3:4 in a molar ratio). In a target used for formation of an In—Zn—O-based oxide semiconductor which has an atomic ratio of In:Zn:O=X:Y:Z, the relation of Z>1.5X+Y is satisfied.

The deposition atmosphere may be a rare gas (typically argon) atmosphere, an oxygen atmosphere, a mixed atmosphere of a rare gas and oxygen, or the like. An atmosphere of a high-purity gas from which impurities such as hydrogen, water, hydroxyl, and hydride are sufficiently removed is preferable, in order to prevent hydrogen, water, hydroxyl, hydride, and the like from entering the oxide semiconductor layer 144.

As the oxide semiconductor layer 144, a c-axis aligned crystalline oxide semiconductor (CAAC-OS) film which is an oxide semiconductor layer including a crystallized portion may be used.

The CAAC-OS film is not completely single crystal nor completely amorphous. The CAAC-OS film is an oxide semiconductor film with a crystal-amorphous mixed phase structure where crystal parts and amorphous parts are included. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to an a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, variation in electric characteristics of the transistor due to irradiation with visible light or ultraviolet light can be reduced. Thus, the transistor has high reliability.

When the oxide semiconductor layer 144 is a CAAC-OS film, the oxide semiconductor layer 144 may be formed while the substrate is heated. The temperature of heating the substrate is preferably higher than or equal to 150° C. and lower than or equal to 450° C., and the substrate temperature is preferably higher than or equal to 200° C. and lower than or equal to 350° C. When the substrate is heated at a high temperature during formation of the oxide semiconductor layer, a CAAC-OS film in which the proportion of a crystalline portion is higher than the proportion of an amorphous portion can be formed.

Note that in the case where the oxide semiconductor layer 144 has crystallinity, a crystal included in the oxide semiconductor layer 144 grows in the direction substantially perpendicular to the surface of the insulating layer 130. Therefore, when planarity of the surface of the insulating layer 130 over which the oxide semiconductor layer 144 is formed is favorable, the crystallinity of the oxide semiconductor layer 144 is improved. In this embodiment, through the rare gas plasma treatment before the oxide semiconductor layer 144 is formed, the planarity of the surface of the insulating layer 130, which is a surface where the oxide semiconductor layer 144 is formed, is improved. Thus, the rare gas plasma treatment is also suitable for improvement of the crystallinity of the oxide semiconductor layer 144.

After the formation of the oxide semiconductor layer 144, heat treatment (first heat treatment) may be performed on the oxide semiconductor layer 144. The heat treatment can further remove hydrogen atoms or substances including hydrogen atoms in the oxide semiconductor layer 144. The heat treatment is performed in an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6N (99.9999%), preferably higher than or equal to 7N (99.99999%) (that is, the concentration of the impurities is lower than or equal to 1 ppm, preferably lower than or equal to 0.1 ppm).

The impurities are reduced by the heat treatment, so that a transistor with extremely excellent characteristics can be realized.

Note that the heat treatment can be referred to as dehydration treatment, dehydrogenation treatment, or the like because of its advantageous effect of removing hydrogen, water, or the like. The heat treatment can be performed at the timing, for example, after the oxide semiconductor layer is processed into an island shape. Such dehydration treatment or dehydrogenation treatment may be conducted once or plural times.

Next, a conductive layer is formed over the oxide semiconductor layer 144 and is processed, so that the source electrode 142a and the drain electrode 142b electrically connected to the oxide semiconductor layer 144 are formed.

The source electrode 142a and the drain electrode 142b can be formed using a metal material such as molybdenum, titanium, tantalum, tungsten, aluminum, copper, chromium, neodymium, or scandium, or an alloy material which includes any of these materials as its main component.

Then, the gate insulating layer 146 is formed over the oxide semiconductor layer 144, the source electrode 142a, and the drain electrode 142b (see FIG. 1D).

The gate insulating layer 146 can have a thickness of 1 nm to 100 nm and can be formed by a sputtering method, an MBE method, a CVD method, a pulsed laser deposition method, an ALD method, or the like as appropriate. Note that in consideration of contact with the oxide semiconductor layer 144, it is preferable that impurities such as hydrogen be sufficiently removed. Accordingly, it is preferable that the gate insulating layer 146 be formed by a sputtering method by which impurities such as hydrogen are less likely to enter the gate insulating layer 146.

The gate insulating layer 146 can be formed using a silicon oxide film, a gallium oxide film, an aluminum oxide film, a silicon nitride film, a silicon oxynitride film, an aluminum oxynitride film, a silicon nitride oxide film, or the like. Further, the gate insulating layer 146 is preferably formed in consideration of the size of a transistor to be formed and the step coverage with the gate insulating layer 146.

In this embodiment, a silicon oxide film of $SiO_{2+\alpha}$ ($\alpha>0$) is used as the gate insulating layer 146. By using the silicon oxide film as the gate insulating layer 146, oxygen can be supplied to the In—Ga—Zn—O-based oxide semiconductor and favorable characteristics can be obtained.

When the gate insulating layer 146 is formed using, for example, a high-k material such as hafnium oxide, yttrium oxide, lanthanum oxide, hafnium silicate ($HfSi_xO_y$ (x>0, y>0)), hafnium aluminate ($HfAl_xO_y$ (x>0, y>0)), hafnium silicate to which nitrogen is added, or hafnium aluminate to which nitrogen is added, gate leakage current can be reduced. Further, the gate insulating layer 146 may have a single-layer structure or a stacked-layer structure.

After the formation of the gate insulating layer 146, second heat treatment may be performed in an inert gas atmosphere or an oxygen atmosphere. The heat treatment temperature is preferably higher than or equal to 200° C. and lower than or equal to 450° C., more preferably higher than or equal to 250° C. and lower than or equal to 350° C. The second heat treatment can reduce variation in electric characteristics of the transistor. Further, in the case where the gate insulating layer 146 in contact with the oxide semiconductor layer 144 contains oxygen, oxygen is supplied to the oxide semiconductor layer 144 to fill oxygen deficiency in the oxide semiconductor layer 144, so that an i-type (intrinsic) or substantially i-type oxide semiconductor layer can be formed.

Note that the second heat treatment is performed after the formation of the gate insulating layer 146 in this embodiment; the timing of the second heat treatment is not limited thereto. For example, the second heat treatment may be performed after the formation of the source electrode 142a and the drain electrode 142b. The second heat treatment may be performed following the first heat treatment.

Next, the gate electrode 148 is formed over the oxide semiconductor layer 144 with the gate insulating layer 146 interposed therebetween (see FIG. 1E). In this embodiment, the gate electrode 148 is provided, which fills the trench 131.

The gate electrode 148 can be formed using a metal material such as molybdenum, titanium, tantalum, tungsten, aluminum, copper, chromium, neodymium, or scandium or an alloy material which contains any of these materials as its main component. As the gate electrode 148, a semiconductor film typified by a polycrystalline silicon film doped with an impurity element such as phosphorus, or a silicide film such as a nickel silicide film may be used. The gate electrode 148 may have a single-layer structure or a stacked-layer structure.

As one layer of the gate electrode 148 which is in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film is preferably used. These films each have a work function of 5 eV or higher, preferably 5.5 eV or higher, which enables the threshold voltage which is one of the electric characteristics of the transistor to be positive when used as the gate electrode. Accordingly, a so-called normally off switching element can be provided.

In this manner, the transistor 162 in this embodiment can be manufactured. In the transistor 162 in this embodiment, the oxide semiconductor layer 144 is provided in contact with the bottom surface and the inner wall surface of the trench 131, whereby the effective channel length of the transistor 162 can be longer than the distance between the source electrode 142a and the drain electrode 142b (an apparent channel length of the transistor 162). For example, in the transistor 162, when the oxide semiconductor layer 144 is formed in contact with the inner wall surface and the bottom surface of the trench, the channel length can be twice or more as large as the width of the bottom surface of the trench (the length of the second region 130b in the channel length direction). Accordingly, the occurrence of a short-channel effect can be suppressed and reduction of the area of the transistor can be achieved.

Further, in the transistor 162 in this embodiment, the region 132 having a curved surface is provided in the upper-end corner portion of the first region 130a with a large thickness of the insulating layer 130, so that the coverage with the oxide semiconductor layer 144 provided in contact with the region and the coverage with the gate insulating layer 146 overlapping with the region with the oxide semiconductor layer 144 interposed therebetween are improved and a disconnection or a defective connection can be prevented. Furthermore, with such a structure, formation of a region with a small thickness locally in the oxide semiconductor layer 144 and the gate insulating layer 146 can be suppressed; thus, the withstand voltage of the transistor 162 can be improved and generation of gate leakage can be suppressed.

Further, a wide-gap semiconductor having a wide band gap is used in a channel formation region of the transistor 162, whereby the off-state current of the transistor 162 can be reduced. In this embodiment, the highly purified and intrinsic oxide semiconductor layer 144 is used in a channel formation region, whereby the off-state current of the transistor 162 can be further reduced.

The structures, methods, and the like described in this embodiment can be combined as appropriate with any of the structures, methods, and the like described in the other embodiments.

(Embodiment 2)

In this embodiment, a semiconductor device having a structure different from the structure described in the above embodiment and a manufacturing method thereof are described with reference to FIGS. 2A to 2F.

Figure 2B:
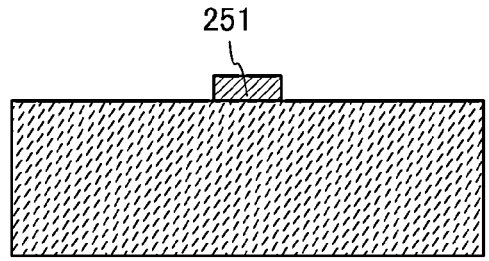
Figure 2C:
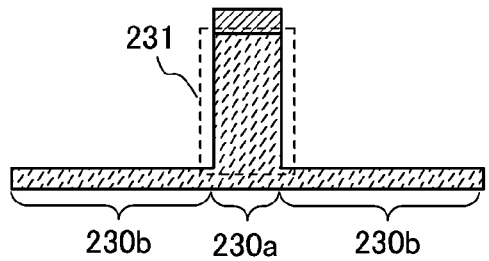
Figure 2D:
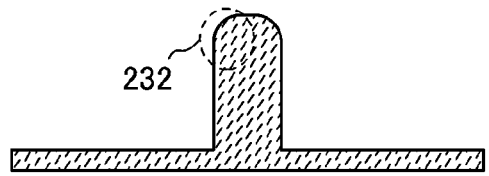
Figure 2E:
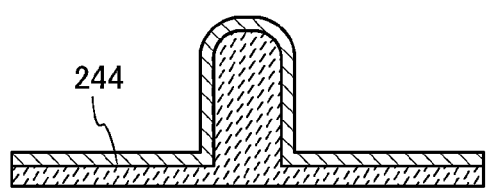
Figure 2F:
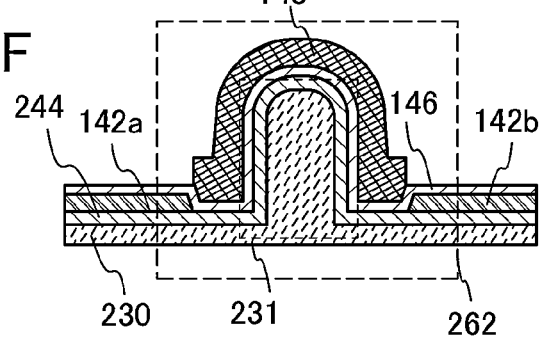

A transistor 262 illustrated in FIG. 2F includes an insulating layer 230 provided with a projecting portion 231, a wide-gap semiconductor layer 244 provided in contact with at least the projecting portion 231 and over the insulating layer 230, the source electrode 142a and the drain electrode 142b electrically connected to the wide-gap semiconductor layer 244, the gate insulating layer 146 provided over the wide-gap semiconductor layer 244, and the gate electrode 148 provided over the gate insulating layer 146 in a region overlapping with the projecting portion 231.

In the transistor 262 illustrated in FIG. 2F, the wide-gap semiconductor layer 244 is provided in contact with a surface of the projecting portion 231 of the insulating layer 230. The cross-sectional shape of the wide-gap semiconductor layer 244 in the channel length direction is a shape curved along the cross-sectional shape of the projecting portion 231, and as the height of the projecting portion 231 increases, the effective channel length of the transistor 262 can increase. In other words, the transistor in this embodiment is the same as the transistor 162 in the above embodiment in that the large effective channel length obtained by extension of a channel formation region in a three-dimensional direction can suppress the occurrence of a short-channel effect while the distance between the source electrode and the drain electrode is finely kept.

In the transistor 262, even when the distance between the source electrode 142a and the drain electrode 142b is shortened, the effective channel length can be kept by appropriately setting the height of the projecting portion 231; thus, the occurrence of a short-channel effect can be suppressed and reduction of the area of the transistor can be accomplished. Note that it is preferable that an upper surface shape of the projecting portion 231 be a stripe shape which extends in the channel-width direction of the transistor 262.

In an upper-end corner portion of the projecting portion 231 of the insulating layer 230, a region having a curved surface is formed by round chamfering. When the upper-end corner portion is a sharp corner portion, a defective shape or the like due to a decrease in coverage with the wide-gap semiconductor layer is caused, and there is a concern that stable electric characteristics are hardly obtained. However, the wide-gap semiconductor layer 244 is provided in contact with at least the region having a curved surface; therefore, the coverage with the wide-gap semiconductor layer 244 is improved and a disconnection or a defective connection can be prevented in the upper-end corner portion of the projecting portion 231.

An example of a manufacturing process of the transistor 262 is described below.

First, the insulating layer 230 is formed over a substrate (not illustrated) containing a semiconductor material, and a metal layer 250 is formed over the insulating layer 230.

A material similar to that of the insulating layer 130 in the above embodiment can be used for the insulating layer 230. Any material can be used as the material of the metal layer 250 as long as the material can be etched using a gas containing fluorine or chlorine. The metal layer 250 can be formed using an element selected from Al, Cr, Ta, Ti, Mo, and W, an alloy including any of these elements as its component, an alloy film including a combination of any of these elements, or the like. Further, one or more materials selected from manganese, magnesium, zirconium, beryllium, and thorium may be used.

Next, a resist mask 240 is formed over the metal layer 250 by a photolithography process (see FIG. 2A). Note that the resist mask 240 may be selectively formed by a droplet discharge method such as an inkjet method, a screen printing method, or the like. By selectively forming the resist mask 240, the usage of resist materials can be reduced and thus manufacturing cost can be reduced.

Then, the metal layer 250 is etched using the resist mask 240 to form a patterned metal layer 251, and then the resist mask 240 is removed (see FIG. 2B). The patterned metal layer 251 functions as a hard mask for forming the projecting portion 231 of the insulating layer 230 in a later step.

The etching of the metal layer 250 may be either wet etching or dry etching. However, dry etching is preferably used for miniaturization. In the case of dry etching, one or both of a gas containing fluorine and a gas containing chlorine can be used as an etching gas. As a gas containing fluorine (a fluorine-based gas), for example, carbon tetrafluoride, sulfur fluoride, nitrogen fluoride, or trifluoromethane can be used. As a gas containing chlorine (a chlorine-based gas), for example, chlorine, boron chloride, silicon chloride, and carbon tetrachloride can be given. In this embodiment, for example, a tungsten film is formed as the metal layer and is etched by dry etching using a mixed gas of carbon tetrafluoride, chlorine, and oxygen as an etching gas, so that the patterned metal layer 251 is formed.

Next, the insulating layer 230 is etched using the patterned metal layer 251 as a mask, so that the projecting portion 231 is formed (see FIG. 2C). Etching of the insulating layer 230 is preferably performed by dry etching, and a mixed gas containing a fluorocarbon-based gas can be used as an etching gas. For example, the following gas can be used: a mixed gas of trifluoromethane, methane, and helium; a mixed gas of carbon tetrafluoride and hydrogen; a mixed gas of trifluoromethane and helium; a mixed gas of octafluorocyclobutane and argon; or a mixed gas of trifluoromethane, carbon tetrafluoride, and argon. By formation of the projecting portion 231, a first region 230a with a first thickness and a second region 230b with a thickness smaller than the first thickness are formed in the insulating layer 230. In other words, the first region 230a is provided between a second region 230b and another second region 230b, so that the projecting portion 231 is formed.

Next, the metal layer 251 is removed by dry etching. One or both of a gas containing fluorine and a gas containing chlorine can be used as an etching gas used for the dry etching.

The etch rate of the insulating layer 230 with the above etching gas is higher than that of the metal layer with the above etching gas; therefore, when the metal layer 251 is etched using the gas, an exposed surface of the insulating layer 230 and a region of the insulating layer 230 in contact with the metal layer 251 are also etched at the same time. Thus, the upper-end corner portion of the first region 230a is rounded (subjected to round chamfering), so that a region 232 having a curved surface is formed (see FIG. 2D). By etching of the metal layer 251, the upper-end corner portion of the first region 230a is processed into a curved shape, preferably with a radius of curvature of greater than or equal to 20 nm and less than or equal to 60 nm.

Then, the wide-gap semiconductor layer 244 is formed in contact with the projecting portion 231 of the insulating layer 230 (see FIG. 2E). The wide-gap semiconductor layer 244 is provided in contact with the first region 230a including the region 232 having a curved surface and with at least part of the second region 230b. When the region 232 having a curved surface is included in the upper-end corner portion of the first region 230a of the insulating layer 230, the coverage with the wide-gap semiconductor layer 244 is improved and a disconnection or a defective connection can be prevented.

Examples of the wide-gap semiconductor are oxide semiconductors having a band gap larger than 1.1 eV which is the band gap of silicon (such as an In—Ga—Zn—O-based oxide semiconductor (3.15 eV), indium oxide (about 3.0 eV), indium tin oxide (about 3.0 eV), indium gallium oxide (about 3.3 eV), indium zinc oxide (about 2.7 eV), tin oxide (about 3.3 eV), and zinc oxide (about 3.37 eV)), GaN (about 3.4 eV), and the like.

The wide-gap semiconductor layer 244 can have a thickness of 1 nm to 100 nm and can be formed by a sputtering method, a molecular beam epitaxy (MBE) method, a pulsed laser deposition method, an atomic layer deposition (ALD) method, or the like as appropriate.

Note that before the wide-gap semiconductor layer 244 is formed, rare gas plasma treatment may be performed on a surface of the insulating layer 230. Through the rare gas plasma treatment, an impurity such as oxygen, moisture, or an organic substance attached to the surface of the insulating layer 230 can be removed by a sputtering effect. Further, the surface of the insulating layer 230 can be planarized. For example, the surface of the insulating layer 230 (including the region 232 having a curved surface) is planarized so that the surface roughness is reduced; the average surface roughness of the insulating layer 230 can be preferably greater than or equal to 0.1 nm and less than 0.5 nm. Through the rare gas plasma treatment, the upper-end corner portion of the first region 230a can be more smoothly.

Next, the source electrode 142a and the drain electrode 142b electrically connected to the wide-gap semiconductor layer 244 are formed, and the gate insulating layer 146 is formed over the wide-gap semiconductor layer 244, the source electrode 142a, and the drain electrode 142b. After that, the gate electrode 148 is formed over the wide-gap semiconductor layer 244 with the gate insulating layer 146 interposed therebetween (see FIG. 2F). The above embodiment can be referred to for details thereof.

In this manner, the transistor 262 in this embodiment can be manufactured. In the transistor 262 in this embodiment, the wide-gap semiconductor layer 244 is provided in contact with the projecting portion 231, whereby the effective channel length of the transistor 262 can be longer than the distance between the source electrode 142a and the drain electrode 142b (an apparent channel length of the transistor 262). For example, in the transistor 262, when the wide-gap semiconductor layer 244 is provided in contact with the projecting portion 231, the channel length can be twice or more as large as the width of the bottom portion of the projecting portion 231 (the length of the first region 230a in the channel length direction). Accordingly, the occurrence of a short-channel effect can be suppressed and reduction of the area of the transistor can be achieved.

Further, in the transistor 262 in this embodiment, the region 232 having a curved surface is provided in the upper-end corner portion of the first region 230a with a large thickness of the insulating layer 230, so that the coverage with the wide-gap semiconductor layer 244 provided in contact with the region and the coverage with the gate insulating layer 146 overlapping with the region with the wide-gap semiconductor layer 244 interposed therebetween are improved and a disconnection or a defective connection can be prevented. Furthermore, with such a structure, formation of a region with a small thickness locally in the wide-gap semiconductor layer 244 and the gate insulating layer 146 can be suppressed; thus, the withstand voltage of the transistor 262 can be improved and generation of gate leakage can be suppressed.

Further, a wide-gap semiconductor having a wide band gap is used in a channel formation region of the transistor 262, whereby the off-state current of the transistor 262 can be reduced.

The structures, methods, and the like described in this embodiment can be combined as appropriate with any of the structures, methods, and the like described in the other embodiments. For example, the round chamfering method described in this embodiment may be replaced with the method described in Embodiment 1, or both the round chamfering method and the method described in Embodiment 1 may be employed.

(Embodiment 3)

In this embodiment, a manufacturing method of a semiconductor device, which is different from the manufacturing methods described in Embodiments 1 and 2, is described. Specifically, a round chamfering method of a trench or a projecting portion, which is different from the methods in Embodiments 1 and 2, is described.

A method for forming a region having a curved surface in an upper-end corner portion of a trench is described with reference to FIGS. 3A-1 to 3A-3.

Figures 1, 3A:
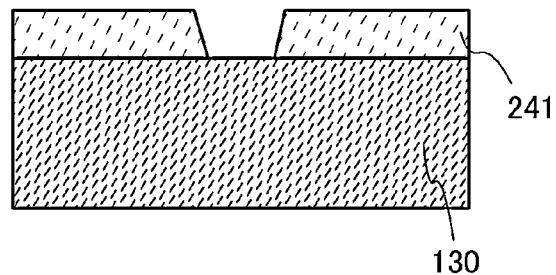
FIGS. 3A-1 to 3A-3 and 3B-1 to 3B-3 are cross-sectional views illustrating manufacturing steps of semiconductor devices.

First, a resist mask 241 having a tapered shape is formed over the insulating layer 130 through a photolithography process (see FIG. 3A-1). A taper angle of the resist mask 241 (an angle between a surface of the insulating layer 130 and a side surface of the resist mask) may be less than 90°. In this embodiment, the taper angle of the resist mask 241 is 75°.

Figures 2, 3A:
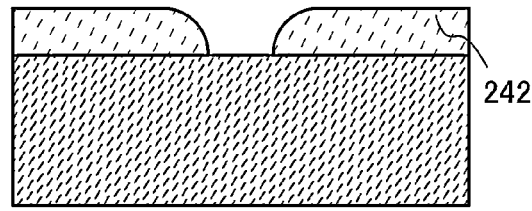
Figures 3, 3A:
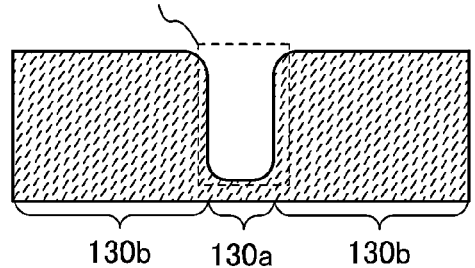

Next, the resist mask 241 having a tapered shape is subjected to heat treatment, whereby a resist mask 242 having a curved surface is formed (see FIG. 3A-2). The radius of curvature of the resist mask 242 can be controlled by the length of time or the temperature of the heat treatment. In this embodiment, the resist mask 241 is subjected to heat treatment at 180° C. for 2 hours, so that the resist mask 242 having a curved surface is formed.

Next, the insulating layer 130 is etched using the resist mask 242 having a curved surface, whereby the trench 131 whose upper-end corner portion (also referred to as an upper-end corner portion of the first region 130a) is processed into a curved shape with a radius of curvature of greater than or equal to 20 nm and less than or equal to 60 nm can be formed.

Next, a method for forming a region having a curved surface in an upper-end corner portion of a projecting portion is described with reference to FIGS. 3B-1 to 3B-3.

Figures 1, 3B:
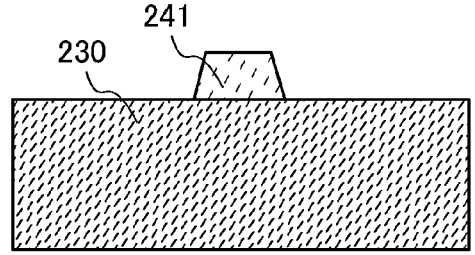
Figures 2, 3B:
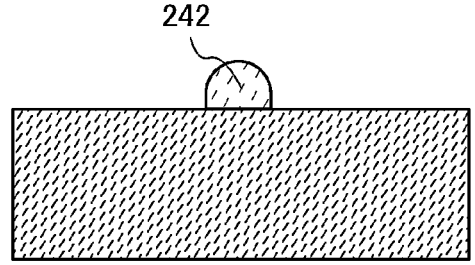
Figures 3, 3B:
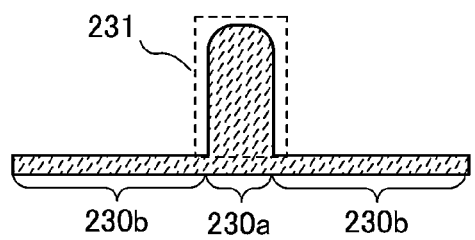

First, the resist mask 241 having a tapered shape is formed over the insulating layer 230 through a photolithography process (see FIG. 3B-1). A taper angle of the resist mask 241 (an angle between a surface of the insulating layer 230 and a side surface of the resist mask) may be less than 90°.

Next, the resist mask 241 having a tapered shape is subjected to heat treatment, whereby the resist mask 242 having a curved surface is formed (see FIG. 3B-2).

Next, the insulating layer 230 is etched using the resist mask 242 having a curved surface, whereby the projecting portion 231 whose upper-end corner portion (also referred to as an upper-end corner portion of the first region 230a) is processed into a curved shape with a radius of curvature of greater than or equal to 20 nm and less than or equal to 60 nm can be formed.

With the use of the insulating layer 130 or the insulating layer 230 processed through the above steps, a semiconductor device of one embodiment of the present invention can be manufactured.

The structures, methods, and the like described in this embodiment can be combined as appropriate with any of the structures, methods, and the like described in the other embodiments.

(Embodiment 4)

In this embodiment, an example of a semiconductor device which includes the transistor 162 described in Embodiment 1, which can hold stored data even when not powered, and which does not have a limitation on the number of write cycles, will be described with reference to the drawings.

Since the off-state current of the transistor 162 is small, stored data can be held for a long time owing to such a transistor. In other words, power consumption can be sufficiently reduced because a semiconductor memory device in which refresh operation is unnecessary or the frequency of refresh operation is extremely low can be provided.

Figure 4A:
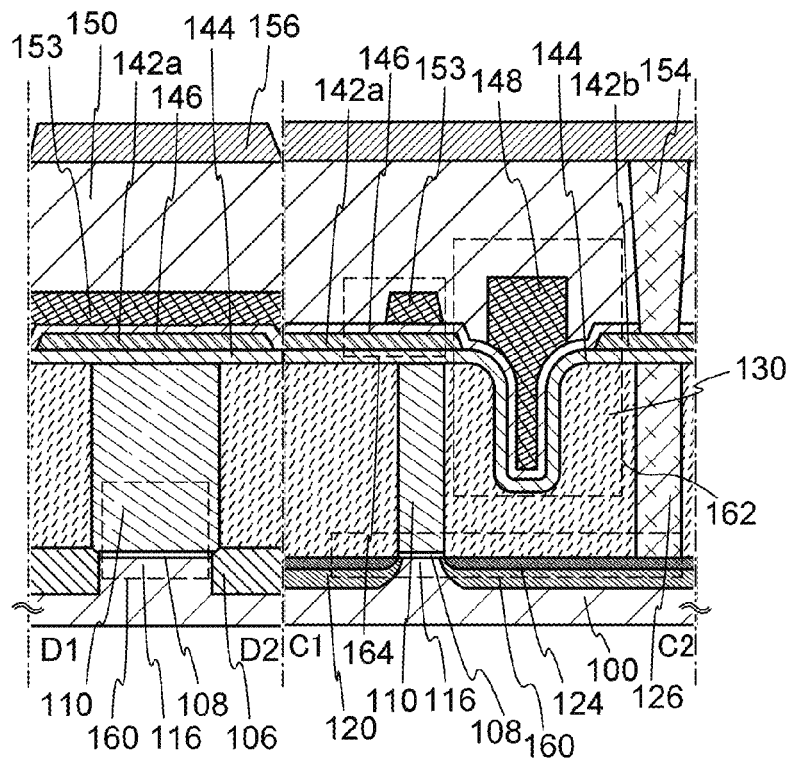
FIGS. 4A to 4C are a cross-sectional view, a plan view, and a circuit diagram illustrating a semiconductor device of one embodiment of the present invention.
Figure 4B:
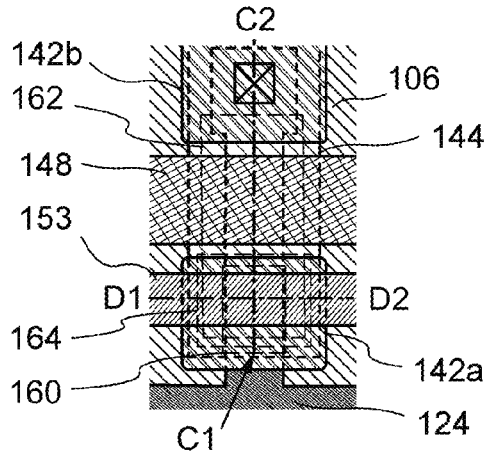
Figure 4C:
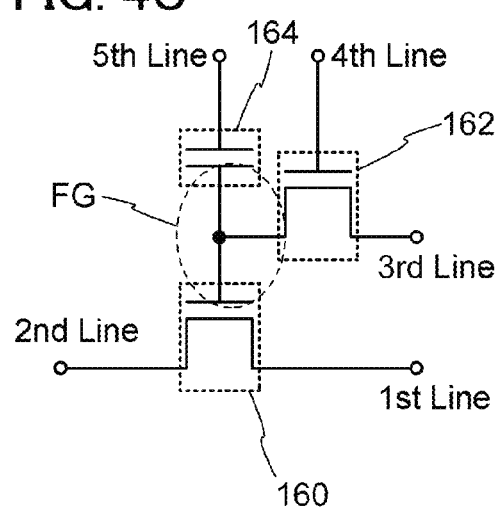

FIGS. 4A to 4C illustrate one example of a structure of the semiconductor device. FIGS. 4A to 4C illustrate a cross-sectional view, a plan view, and a circuit diagram, respectively, of the semiconductor device. Here, FIG. 4A corresponds to cross sections taken along line C1-C2 and line D1-D2 in FIG. 4B.

The semiconductor device illustrated in FIGS. 4A and 4B includes a transistor 160 including a first semiconductor material in a lower portion, and a transistor 162 including a second semiconductor material in an upper portion. Note that the structure of the transistor 162 is the same as that described in Embodiment 1; thus, for description of FIGS. 4A and 4B, the same reference numerals are used for the same parts as those in FIGS. 1A to 1E. Note that the transistor 262 described in Embodiment 2 can be used instead of the transistor 162.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor can hold charge for a long time owing to its characteristics.

Although all the transistors are n-channel transistors here, it is needless to say that p-channel transistors can be used. The technical nature of the disclosed invention is to use a wide-gap semiconductor in the transistor 162 so that data can be held. Therefore, it is not necessary to limit a specific structure of the semiconductor device, such as a material of the semiconductor device or a structure of the semiconductor device, to those described here.

The transistor 160 in FIG. 4A includes a channel formation region 116 provided in a substrate 100 including a semiconductor material (e.g., silicon), impurity regions 120 provided such that the channel formation region 116 is sandwiched therebetween, metal compound regions 124 (regions of which resistance is reduced by reaction of a semiconductor material and a metal material) in contact with the impurity regions 120, a gate insulating layer 108 provided over the channel formation region 116, and a gate electrode 110 provided over the gate insulating layer 108.

An electrode 126 is connected to part of the metal compound region 124 of the transistor 160. Here, the electrode 126 functions as a source electrode or a drain electrode of the transistor 160. Further, an element isolation insulating layer 106 is formed over the substrate 100 so as to surround the transistor 160, and the insulating layer 130 is formed to cover the transistor 160. Note that in order to realize high integration, the transistor 160 preferably has a structure without a sidewall insulating layer as illustrated in FIG. 4A. On the other hand, when the characteristics of the transistor 160 have priority, the sidewall insulating layer may be formed on a side surface of the gate electrode 110 and the impurity regions 120 may include a region having a different impurity concentration.

As illustrated in FIG. 4A, the transistor 162 includes a wide-gap semiconductor and has a trench structure. In this embodiment, as the wide-gap semiconductor, the oxide semiconductor layer 144 is used. Here, the oxide semiconductor layer 144 is preferably highly purified. By using a highly purified oxide semiconductor, the transistor 162 which has extremely favorable off-state current characteristics can be obtained.

A conductive layer 153 is provided in a region overlapping with the source electrode 142a of the transistor 162 with the gate insulating layer 146 interposed therebetween; a capacitor 164 includes the source electrode 142a, the gate insulating layer 146, and the conductive layer 153. That is, the source electrode 142a of the transistor 162 functions as one electrode of the capacitor 164, and the conductive layer 153 functions as the other electrode of the capacitor 164. The conductive layer 153 can be manufactured through the same steps as the gate electrode 148.

Note that the capacitor 164 may be omitted if a capacitor is not needed. Further, the capacitor 164 may be separately provided above the transistor 162. For example, a trench-type capacitor or a stack-type capacitor may be separately formed above the transistor 162 or below the transistor 160 so as to be three-dimensionally stacked, whereby the degree of integration may be further increased.

An insulating layer 150 is provided over the transistor 162 and the capacitor 164. Further, a wiring 156 for connecting the transistor 162 to another transistor is provided over the insulating layer 150. The wiring 156 is electrically connected to the drain electrode 142b through the electrode 154 formed in an opening which is formed in the insulating layer 150, the gate insulating layer 146, or the like. Here, the electrode 154 is preferably provided so as to overlap with at least part of the oxide semiconductor layer 144 of the transistor 162.

In FIGS. 4A and 4B, the transistor 160 and the transistor 162 are provided so as to overlap with each other at least partly. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 153 of the capacitor 164 is provided so as to overlap with at least part of the gate electrode 110 of the transistor 160. With such a planar layout, the area occupied by the semiconductor device can be reduced; thus, high integration can be achieved.

Note that although the metal compound region 124, the drain electrode 142b, and the wiring 156 are connected to one another through the electrode 126 and the electrode 154 in FIG. 4A, the disclosed invention is not limited thereto. For example, the drain electrode 142b may be in direct contact with the metal compound region 124. Alternatively, the wiring 156 may be in direct contact with the drain electrode 142b.

Next, an example of a circuit configuration corresponding to FIGS. 4A and 4B is illustrated in FIG. 4C.

In FIG. 4C, a first wiring (a 1st Line) is electrically connected to a source electrode of the transistor 160. A second wiring (a 2nd Line) is electrically connected to a drain electrode of the transistor 160. A third wiring (a 3rd Line) is electrically connected to one of the source electrode and the drain electrode of the transistor 162, and a fourth wiring (a 4th Line) is electrically connected to a gate electrode of the transistor 162. The gate electrode of the transistor 160 and the other of the source electrode and the drain electrode of the transistor 162 are electrically connected to one electrode of the capacitor 164, and a fifth wiring (a 5th line) is electrically connected to the other electrode of the capacitor 164.

The semiconductor device in FIG. 4C utilizes a characteristic in which the potential of the gate electrode of the transistor 160 can be held, and can thus write, hold, and read data as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is given to the gate electrode of the transistor 160 (writing of data). Here, one of two kinds of charges providing different potentials (hereinafter referred to as a low-level charge and a high-level charge) is applied. After that, the potential of the fourth wiring is set to a potential at which the transistor 162 is turned off, so that the transistor 162 is turned off. Thus, the charge given to the gate electrode of the transistor 160 is held (holding of data).

Since the off-state current of the transistor 162 is extremely small, the charge of the gate electrode of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the data held can be read by measuring the potential of the second wiring.

Note that in the case where memory cells are arrayed to be used, data of only desired memory cells needs to be read. In the case where such reading is not performed, a potential at which the transistor 160 is turned off regardless of the state of the gate electrode of the transistor 160, that is, a potential smaller than $V_{th\_H}$ may be given to the fifth wiring. Alternatively, a potential at which the transistor 160 is turned on regardless of the state of the gate electrode, that is, a potential higher than $V_{th\_L}$ may be given to the fifth wiring.

In the semiconductor device described in this embodiment, the transistor in which a wide-gap semiconductor (for example, an oxide semiconductor) is used for a channel formation region and in which the off-state current is extremely small is applied, whereby stored data can be held for an extremely long time. In other words, power consumption can be sufficiently reduced because refresh operation becomes unnecessary or the frequency of refresh operation can be sufficiently low. Moreover, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the disclosed invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

In addition, by employing the trench structure for the transistor 162, a reduction of the planar area of the transistor 162 can be achieved, so that high integration can be achieved.

The structures, methods, and the like described in this embodiment can be combined as appropriate with any of the structures, methods, and the like described in the other embodiments.

(Embodiment 5)

In this embodiment, a semiconductor device which includes the transistor 262 described in Embodiment 2, which can hold stored data even when not powered, which does not have a limitation on the number of write cycles, and which has a structure different from the structure described in Embodiment 4, will be described with reference to FIGS. 5A and 5B and FIGS. 6A and 6B. Note that the transistor 162 described in Embodiment 1 can be used instead of the transistor 262.

Figure 5A:
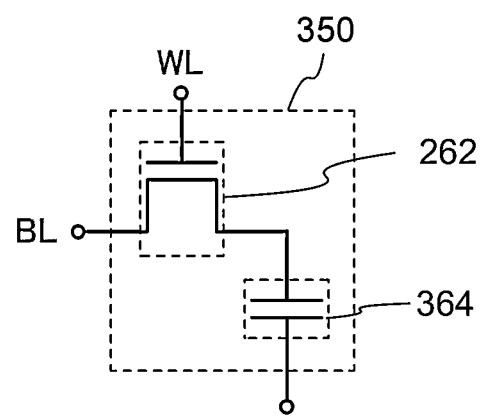
FIGS. 5A and 5B are a circuit diagram and a perspective view illustrating a semiconductor device of one embodiment of the present invention.
Figure 5B:
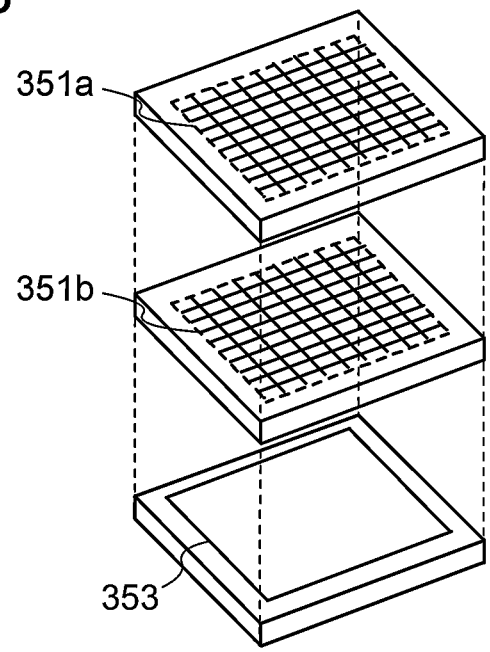

FIG. 5A illustrates an example of a circuit configuration of a semiconductor device, and FIG. 5B is a conceptual diagram illustrating an example of a semiconductor device. First, the semiconductor device illustrated in FIG. 5A will be described, and then, the semiconductor device illustrated in FIG. 5B will be described.

In the semiconductor device illustrated in FIG. 5A, a bit line BL is electrically connected to a source electrode or a drain electrode of the transistor 262, a word line WL is electrically connected to a gate electrode of the transistor 262, and a source electrode or a drain electrode of the transistor 262 is electrically connected to a first terminal of a capacitor 364.

The transistor 262 including a wide-gap semiconductor has small off-state current. In particular, when a highly purified oxide semiconductor is used as the wide-gap semiconductor, the off-state current can be extremely small. For that reason, a potential of the first terminal of the capacitor 364 (or a charge accumulated in the capacitor 364) can be held for an extremely long time by turning off the transistor 262. Further, in the transistor 262, a short-channel effect is not likely to be caused, which is advantageous.

Next, writing and holding of data in the semiconductor device (a memory cell 350) illustrated in FIG. 5A will be described.

First, the potential of the word line WL is set to a potential at which the transistor 262 is turned on, so that the transistor 262 is turned on. Accordingly, the potential of the bit line BL is supplied to the first terminal of the capacitor 364 (writing of data). After that, the potential of the word line WL is set to a potential at which the transistor 262 is turned off, so that the transistor 262 is turned off. Thus, the potential of the first terminal of the capacitor 364 is held (holding of data).

Because the off-state current of the transistor 262 is extremely small, the potential of the first terminal of the capacitor 364 (or the charge accumulated in the capacitor) can be held for a long time.

Secondly, reading of data will be described. When the transistor 262 is turned on, the bit line BL which is in a floating state and the capacitor 364 are electrically connected to each other, and the charge is redistributed between the bit line BL and the capacitor 364. As a result, the potential of the bit line BL is changed. The amount of change in potential of the bit line BL varies depending on the potential of the first terminal of the capacitor 364 (or the charge accumulated in the capacitor 364).

For example, the potential of the bit line BL after charge redistribution is $(C_B \times V_{B0} + C \times V)/(C_B + C)$, where V is the potential of the first terminal of the capacitor 364, C is the capacitance of the capacitor 364, $C_B$ is the capacitance of the bit line BL (hereinafter also referred to as bit line capacitance), and $V_{B0}$ is the potential of the bit line BL before the charge redistribution. Therefore, it can be found that assuming that the memory cell 350 is in either of two states in which the potentials of the first terminal of the capacitor 364 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 5A can hold charge that is accumulated in the capacitor 364 for a long time because the off-state current of the transistor 262 is extremely small. In other words, power consumption can be sufficiently reduced because refresh operation becomes unnecessary or the frequency of refresh operation can be extremely low. Moreover, stored data can be held for a long time even when power is not supplied.

Next, the semiconductor device illustrated in FIG. 5B will be described.

The semiconductor device illustrated in FIG. 5B includes memory cell arrays 351a and 351b including a plurality of memory cells 350 illustrated in FIG. 5A as a memory circuit in an upper portion, and a peripheral circuit 353 in a lower portion which is necessary for operation of the memory cell array 351 (the memory cell arrays 351a and 351b). Note that the peripheral circuit 353 is electrically connected to the memory cell array 351.

In the structure illustrated in FIG. 5B, the peripheral circuit 353 can be provided under the memory cell array 351 (the memory cell arrays 351a and 351b). Thus, the size of the semiconductor device can be decreased.

It is preferable that a semiconductor material of a transistor provided in the peripheral circuit 353 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 5B illustrates, as an example, the semiconductor device in which two memory cell arrays 351 (the memory cell arrays 351a and 351b) are stacked; however, the number of memory cells to be stacked is not limited thereto. Three or more memory cells may be stacked.

Next, a specific structure of the memory cell 350 illustrated in FIG. 5A will be described with reference to FIGS. 6A and 6B.

Figure 6A:
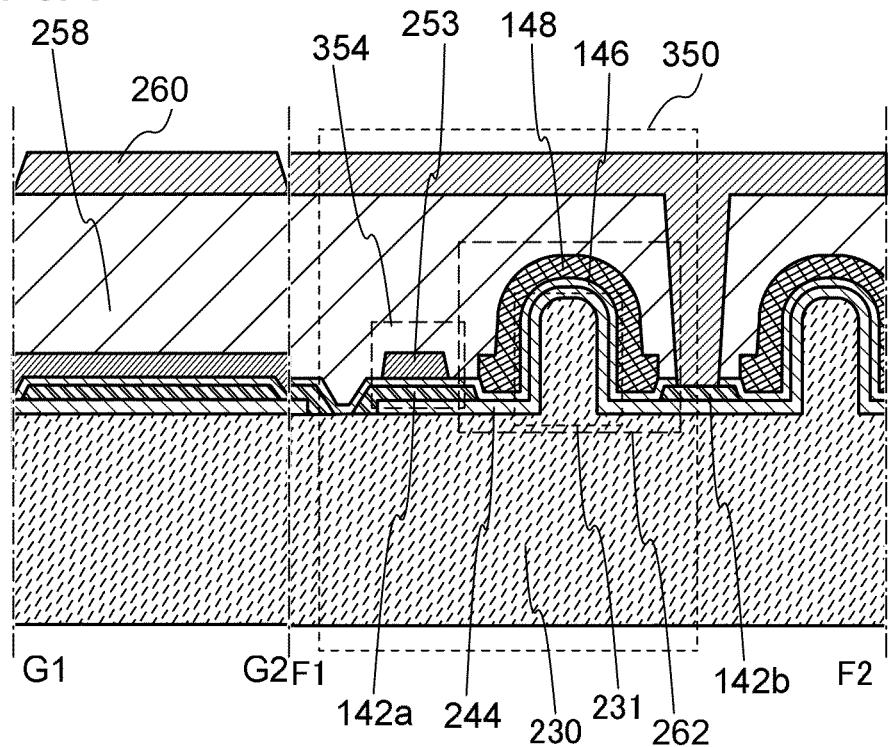
FIGS. 6A and 6B are a cross-sectional view and a plan view illustrating a semiconductor device of one embodiment of the present invention.
Figure 6B:
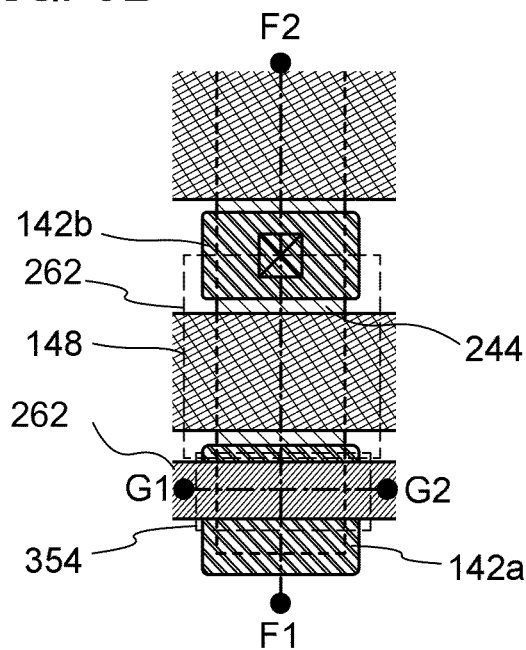

FIGS. 6A and 6B illustrate an example of a structure of the memory cell 350. FIG. 6A illustrates cross-sections of the memory cell 350, and FIG. 6B is a plan view of the memory cell 350. Here, FIG. 6A illustrates cross sections taken along line F1-F2 and line G1-G2 in FIG. 6B.

The structure of the transistor 262 illustrated in FIGS. 6A and 6B is the same as that described in Embodiment 2; thus, for description of FIGS. 6A and 6B, the same reference numerals are used for the same parts as those in FIGS. 2A to 2F.

A conductive layer 253 is provided in a region overlapping with the source electrode 142a of the transistor 262 with the gate insulating layer 146 interposed therebetween; a capacitor 354 includes the source electrode 142a, the gate insulating layer 146, and the conductive layer 253. That is, the source electrode 142a of the transistor 262 functions as one electrode of the capacitor 354, and the conductive layer 253 functions as the other electrode of the capacitor 354.

An insulating layer 258 is provided over the transistor 262 and the capacitor 354. Further, a wiring 260 for connecting the memory cell 350 to an adjacent memory cell 350 is provided over the insulating layer 258. The wiring 260 is electrically connected to the drain electrode 142b of the transistor 262 through an opening which is provided in the gate insulating layer 146, the insulating layer 258, or the like. Alternatively, the wiring 260 may be electrically connected to the drain electrode 142b through another conductive layer provided in the opening. Note that the wiring 260 corresponds to the bit line BL in the circuit diagram of FIG. 5A.

In FIGS. 6A and 6B, the drain electrode 142b of the transistor 262 also functions as a source electrode of the transistor included in the adjacent memory cell. With such a planar layout, the area occupied by the semiconductor device can be reduced; thus, high integration can be achieved.

As described above, the plurality of memory cells formed in multiple layers in the upper portion is each formed with a transistor including an oxide semiconductor as a wide-gap semiconductor layer. Since the off-state current of the transistor including an oxide semiconductor as a wide-gap semiconductor layer is small, stored data can be held for a long time owing to such a transistor. In other words, power consumption can be sufficiently reduced because the frequency of refresh operation can be extremely low.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

This embodiment can be implemented in appropriate combination with the structures described in the other embodiments.

(Embodiment 6)

In this embodiment, examples of application of the semiconductor device described in any of the above embodiments to portable devices such as cellular phones, smartphones, or e-book readers will be described with reference to FIGS. 7A and 7B, FIG. 8, FIG. 9, and FIG. 10.

In a portable device such as a cellular phone, a smartphone, or an e-book reader, an SRAM or a DRAM is used so as to store image data temporarily. The reason why an SRAM or a DRAM is used is that a flash memory is slow in responding and is not suitable for image processing. However, an SRAM or a DRAM has the following features when used for temporary storage of image data.

Figure 7A:
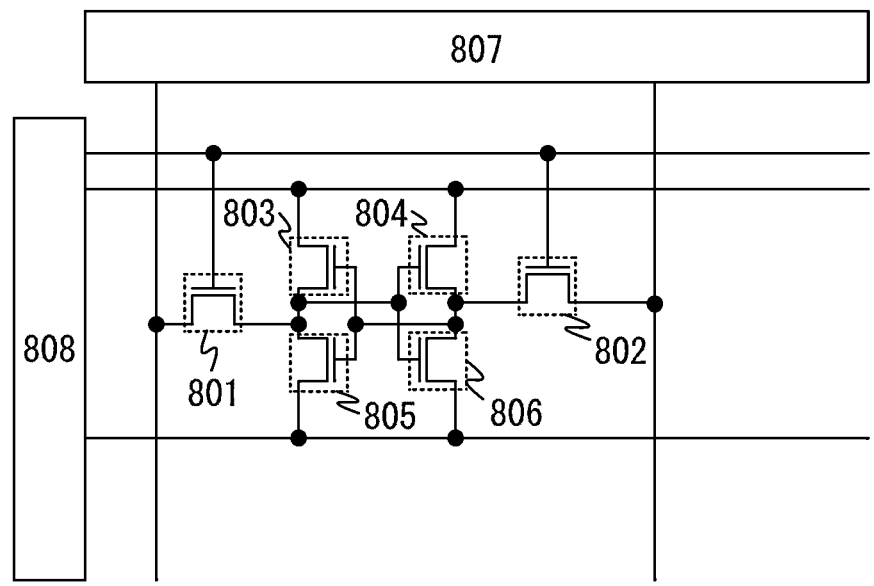
FIGS. 7A and 7B are circuit diagrams each illustrating a semiconductor device of one embodiment of the present invention.

In a normal SRAM, as illustrated in FIG. 7A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 7B:
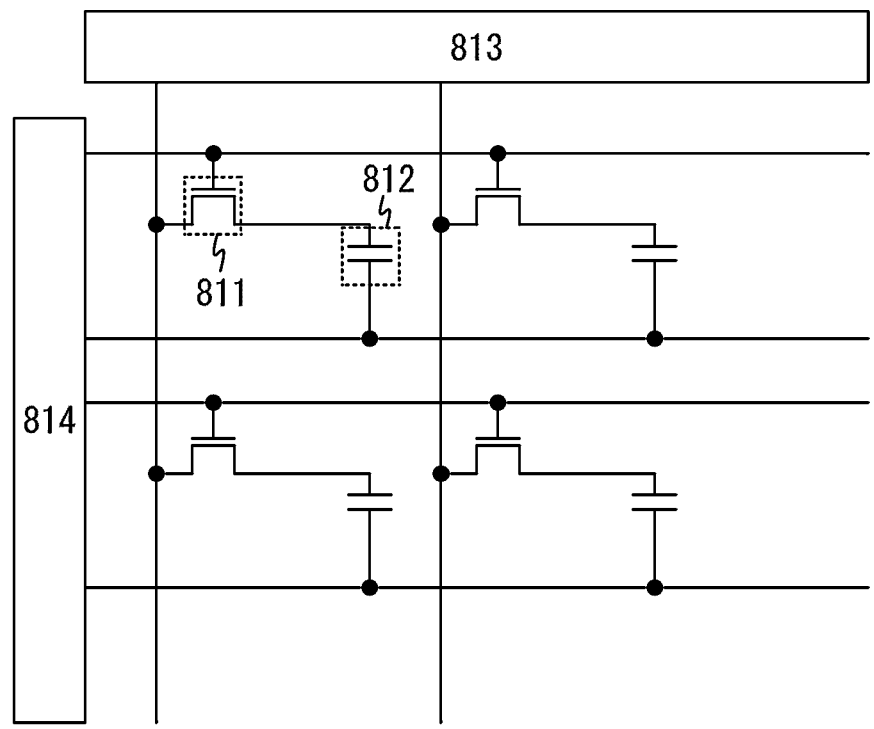

On the other hand, as illustrated in FIG. 7B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described in any of the above embodiments is about 10 $F^2$ and frequent refresh operations are not needed. Therefore, the area of the memory cell is reduced, and the power consumption can be reduced.

Figure 8:
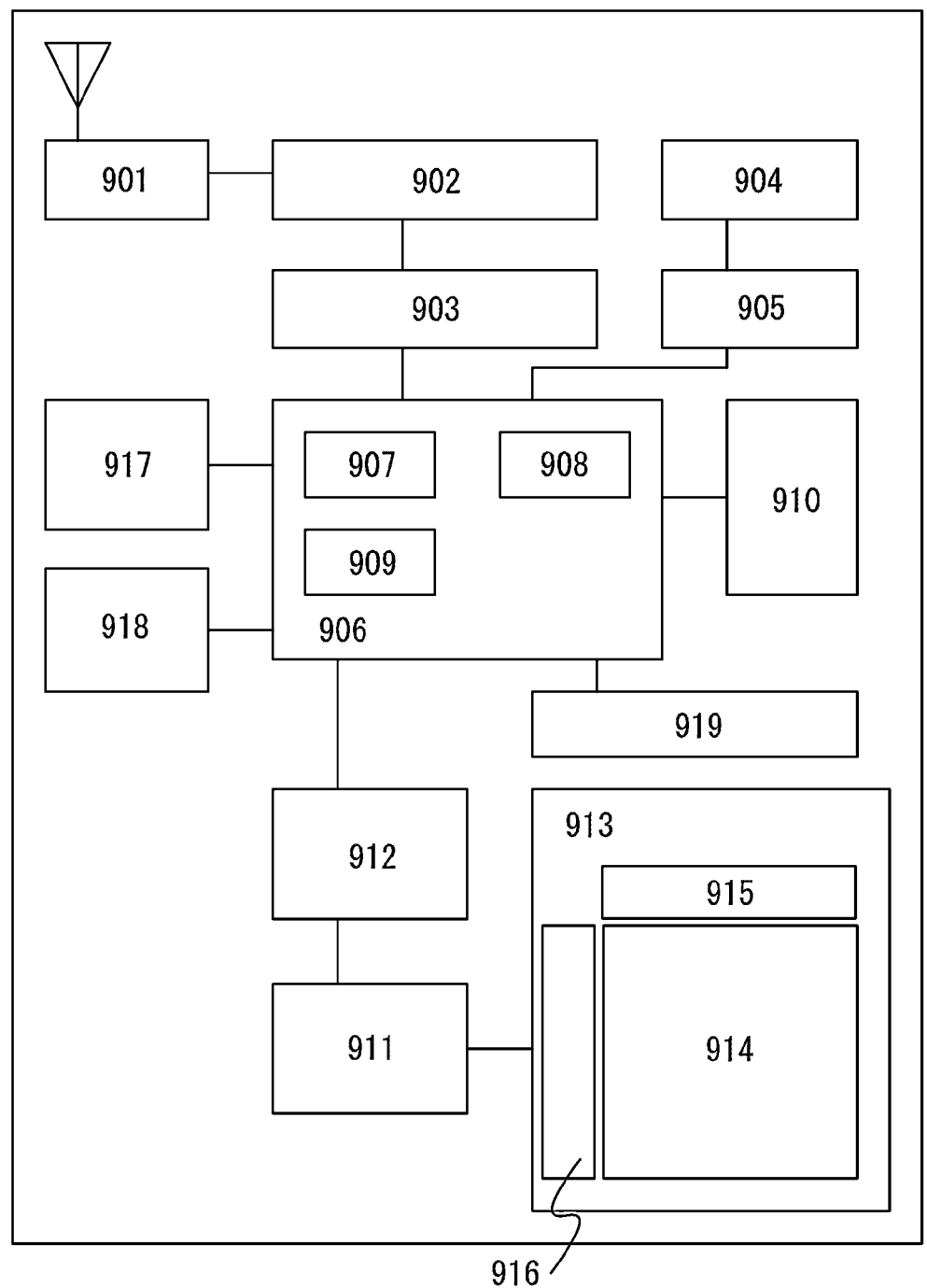
FIG. 8 is a block diagram illustrating a semiconductor device of one embodiment of the present invention.

Next, a block diagram of a portable device is illustrated in FIG. 8. A portable device illustrated in FIG. 8 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 9:
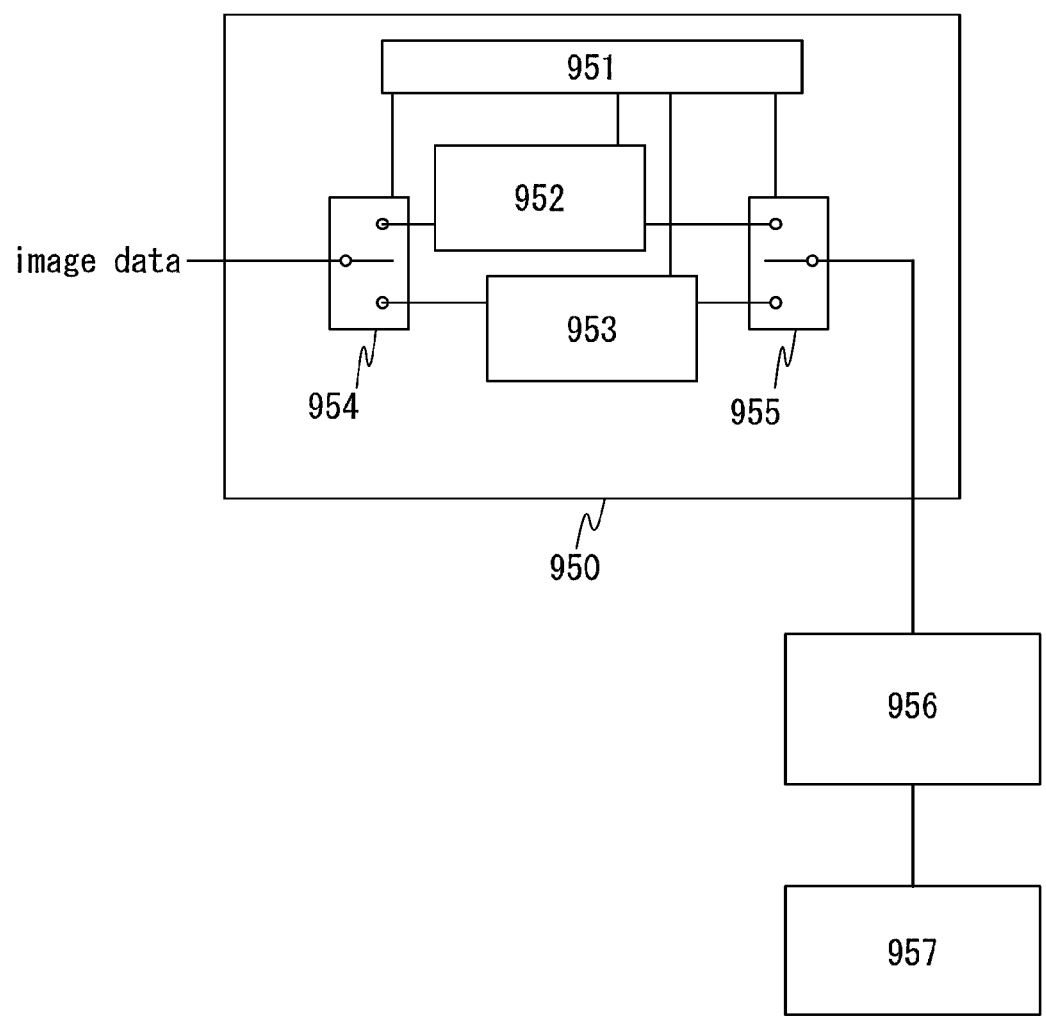
FIG. 9 is a block diagram illustrating a semiconductor device of one embodiment of the present invention.

Next, FIG. 9 shows an example in which the semiconductor device described in any of the above embodiments is used for a memory circuit 950 in a display. The memory circuit 950 illustrated in FIG. 9 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and stored for a long time, and power consumption can be sufficiently reduced.

Figure 10:
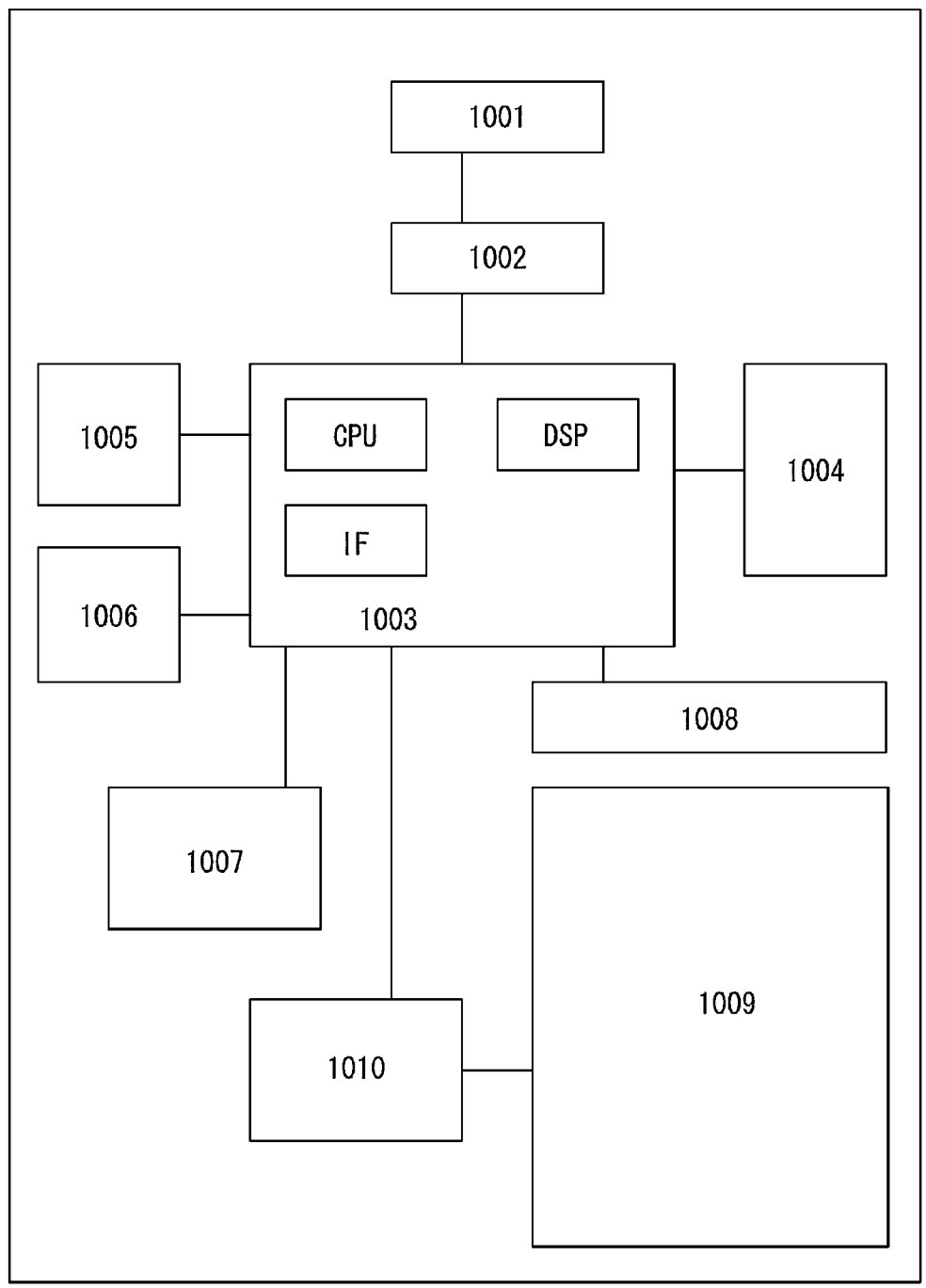
FIG. 10 is a block diagram illustrating a semiconductor device of one embodiment of the present invention.

Next, FIG. 10 is a block diagram of an e-book reader. FIG. 10 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 10. The memory circuit 1007 has a function of temporarily storing the contents of a book. For example, a user may use a highlight function. In some cases, a user wants to mark a specific portion while reading an e-book reader. This marking function is called a highlight function and is used to make a difference from the other portions by changing the display color, underlining, making characters bold, changing the font of characters, or the like. The function makes it possible to store and hold data of a portion specified by a user. In order to store the data for a long time, the data may be copied to the flash memory 1004. Also in such a case, the semiconductor device described in any of the above embodiments is used, whereby writing and reading of data can be performed at high speed, data can be stored for a long time, and power consumption can be sufficiently reduced.

As described above, the portable devices described in this embodiment each incorporates the semiconductor device according to any of the above embodiments. Therefore, it is possible to obtain a portable device which is capable of reading data at high speed, storing data for a long time, and reducing power consumption.

The structures, methods, and the like described in this embodiment can be combined as appropriate with any of the structures, methods, and the like described in the other embodiments.

EXAMPLE 1

In this example, an example is described in which a trench having a curved surface is formed in an upper-end corner portion by the manufacturing method described in Embodiment 1 and an oxide semiconductor layer is formed in contact with the trench.

A method for manufacturing samples used in this example is described below.

A silicon substrate was used as a substrate, and a silicon oxide film with a thickness of 500 nm was formed over the silicon substrate as an insulating layer by a sputtering method.

The silicon oxide film was formed under the following conditions: a silicon oxide ($SiO_2$) target was used as a target, the distance between the silicon substrate and the target was 60 mm, the pressure was 0.4 Pa, the radio frequency (RF) power was 2 kW, the atmosphere was a mixed atmosphere of argon and oxygen (the argon flow rate was 25 sccm and the oxygen flow rate was 25 sccm), and the substrate temperature was 100° C.

Next, a resist mask was formed over the silicon oxide film by a photolithography process, and the silicon oxide film was etched using the resist mask to form a trench. The etching step was performed using an inductively coupled plasma (ICP) etching method under the following conditions: the substrate temperature was 70° C., trifluoromethane ($CHF_3$), helium (He), and methane ($CH_4$) ($CHF_3$:He:$CH_4$=22.5 sccm:127.5 sccm:5 sccm) were used as an etching gas, the power of the power source was 475 W, the bias power was 300 W, and the pressure was 3.0 Pa. The width of a bottom surface of the trench in a cross section was approximately 350 nm Next, round chamfering was performed on an upper-end corner portion of the trench through argon plasma treatment. The argon plasma treatment was performed using an ICP etching method for 3 minutes under the following conditions: the substrate temperature was −10° C., the power of the power source was 500 W, the bias power was 100 W, the pressure was 1.35 Pa, and the flow rate of an argon gas was 100 sccm. After the argon plasma treatment, a region having a curved surface with a radius of curvature of greater than or equal to 20 nm and less than or equal to 60 nm was formed in the upper-end corner portion of the trench.

After that, an In—Ga—Zn—O film was formed as an oxide semiconductor layer in contact with an inner wall surface of the trench, the bottom surface of the trench, and the uppermost surface of the insulating layer by a sputtering method.

In this example, the oxide semiconductor layer was formed while the substrate was heated to 200° C. The In—Ga—Zn—O film was formed under the following conditions: a metal oxide target having a composition ratio of In:Ga:Zn=1:1:1 [atomic ratio] was used, the distance between the silicon substrate and the target was 60 mm, the pressure was 0.4 Pa, the direct current (DC) power was 0.5 kW, and the atmosphere was a mixed atmosphere of argon and oxygen (the argon flow rate was 30 sccm and the oxygen flow rate was 15 sccm). The thickness of the oxide semiconductor layer was 20 nm.

Figure 11A:
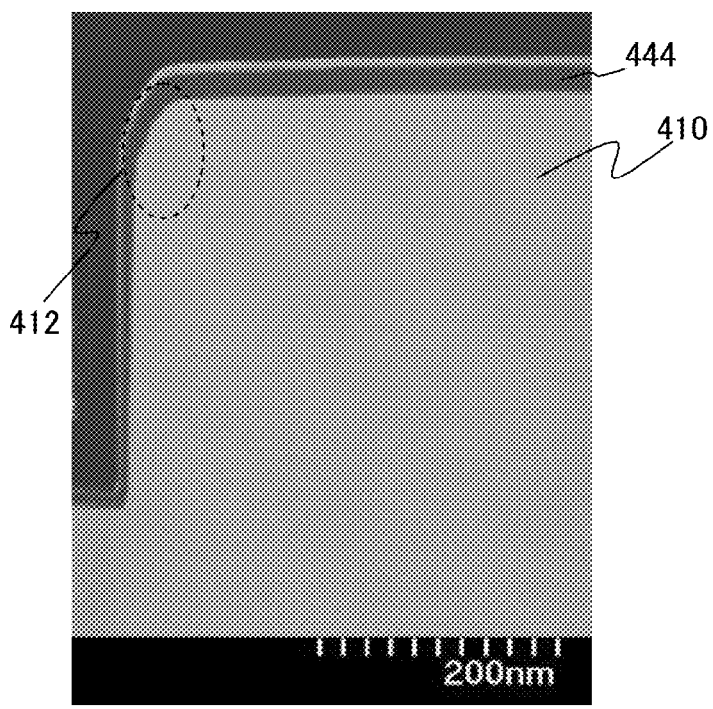
FIGS. 11A and 11B are STEM (Scanning Transmission Electron Microscope) images of samples manufactured in Example 1.

Cross sections of a sample of this example obtained through the above steps (hereinafter referred to as Sample 1) and a sample on which argon plasma treatment was not performed after the trench was formed and in which an oxide semiconductor layer was formed under the same conditions (hereinafter referred to as Sample 2), which was used as a comparative example, were observed by scanning transmission electron microscopy (STEM). FIG. 11A is a STEM image of Sample 1, and FIG. 11B is a STEM image of Sample 2.

Figure 11B:
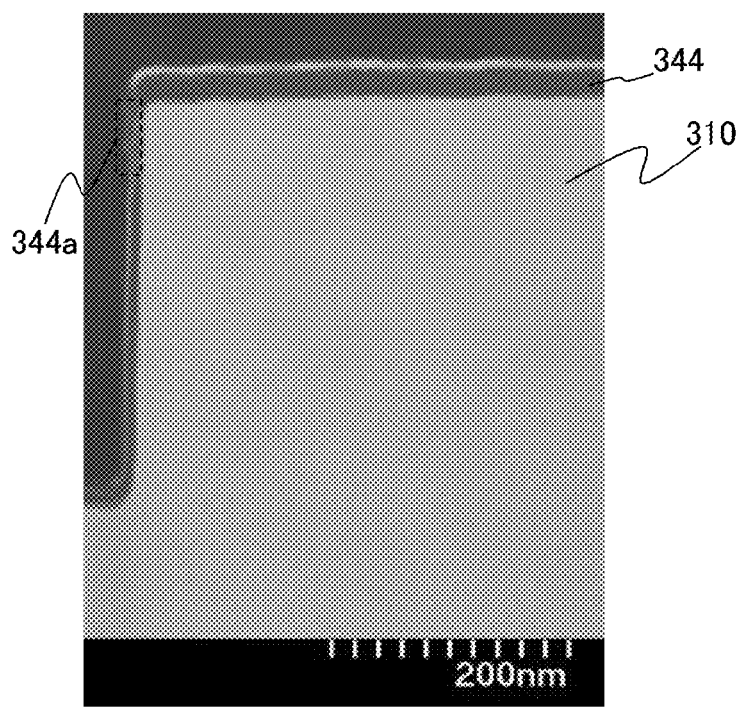

FIG. 11B indicates that in Sample 2 without argon plasma treatment, a sharp corner is formed in an upper-end corner portion of a trench formed in an insulating layer 310. In an oxide semiconductor layer 344 provided in contact with the insulating layer 310, defective film formation occurs in a region 344a in contact with the above upper-end corner portion of the trench having the corner. This is considered to be because coverage defects occur in the upper-end corner portion of the trench of the insulating layer 310 on which round chamfering was not performed.

On the other hand, FIG. 11A indicates that in Sample 1 of this example, a region 412 having a curved surface was formed in an upper-end corner portion of a trench formed in an insulating layer 410 through argon plasma treatment, and an oxide semiconductor layer 444 provided in contact with the insulating layer 410 was formed with good coverage.

As described above, it is confirmed that a region having a curved surface can be provided in an upper-end corner portion of a trench (which can also be referred to as an upper-end corner portion of a first region with a large thickness of an insulating layer) through argon plasma treatment. It is also confirmed that the oxide semiconductor layer provided in contact with the region having a curved surface can be formed with good coverage.

EXAMPLE 2

In this example, an example is described in which a projecting portion having a curved surface is formed in an upper-end corner portion by the manufacturing method described in Embodiment 2 and an oxide semiconductor layer is formed in contact with the projecting portion.

A method for manufacturing a sample used in this example is described below.

A silicon substrate was used as a substrate, and a silicon oxide film with a thickness of 500 nm was formed over the silicon substrate as an insulating layer by a sputtering method.

The silicon oxide film was formed under the following conditions: a silicon oxide ($SiO_2$) target was used as a target, the distance between the silicon substrate and the target was 60 mm, the pressure was 0.4 Pa, the radio frequency (RF) power was 2 kW, the atmosphere was a mixed atmosphere of argon and oxygen (the argon flow rate was 25 sccm and the oxygen flow rate was 25 sccm), and the substrate temperature was 100° C.

Next, as a metal layer, a tungsten film with a thickness of 100 nm was formed over the silicon oxide film. After that, a resist mask was formed over the tungsten film by a photolithography process and the tungsten film was etched using the resist mask, so that a tungsten film which was patterned was obtained. The etching step of the tungsten film was performed using an ICP etching method under the following conditions: the substrate temperature was 70° C., carbon tetrafluoride ($CF_4$), chlorine (CO, and oxygen ($O_2$) ($CF_4$:Cl:$O_2$=25 sccm:25 sccm:10 sccm) were used as an etching gas, the power of the power source was 500 W, the bias power was 100 W, and the pressure was 1.5 Pa.

After the tungsten film was patterned, the resist mask was removed, and the silicon oxide film was etched using the patterned tungsten film as a hard mask, so that a projecting portion was formed. The etching step of the silicon oxide film was performed using an ICP etching method under the following conditions: the substrate temperature was 70° C., trifluoromethane ($CHF_3$), helium (He), and methane ($CH_4$) ($CHF_3$:He:$CH_4$=22.5 sccm:127.5 sccm:5 sccm) were used as an etching gas, the power of the power source was 475 W, the bias power was 300 W, and the pressure was 3.0 Pa.

Next, a dry etching step was performed under the same conditions as those of the above patterning of the tungsten film and the tungsten film used as the hard mask was removed. After the dry etching step, a region having a curved surface with a radius of curvature of greater than or equal to 20 nm and less than or equal to 60 nm was formed in an upper-end corner portion of the projecting portion.

After that, an In—Ga—Zn—O film was formed as an oxide semiconductor layer in contact with the projecting portion by a sputtering method.

In this example, the oxide semiconductor layer was formed while the substrate was heated to 200° C. The In—Ga—Zn—O film was formed under the following conditions: a metal oxide target having a composition ratio of In:Ga:Zn=1:1:1 [atomic ratio] was used, the distance between the silicon substrate and the target was 60 mm, the pressure was 0.4 Pa, the direct current (DC) power was 0.5 kW, and the atmosphere was a mixed atmosphere of argon and oxygen (the argon flow rate was 30 sccm and the oxygen flow rate was 15 sccm). The thickness of the oxide semiconductor layer was 20 nm.

Figure 12:
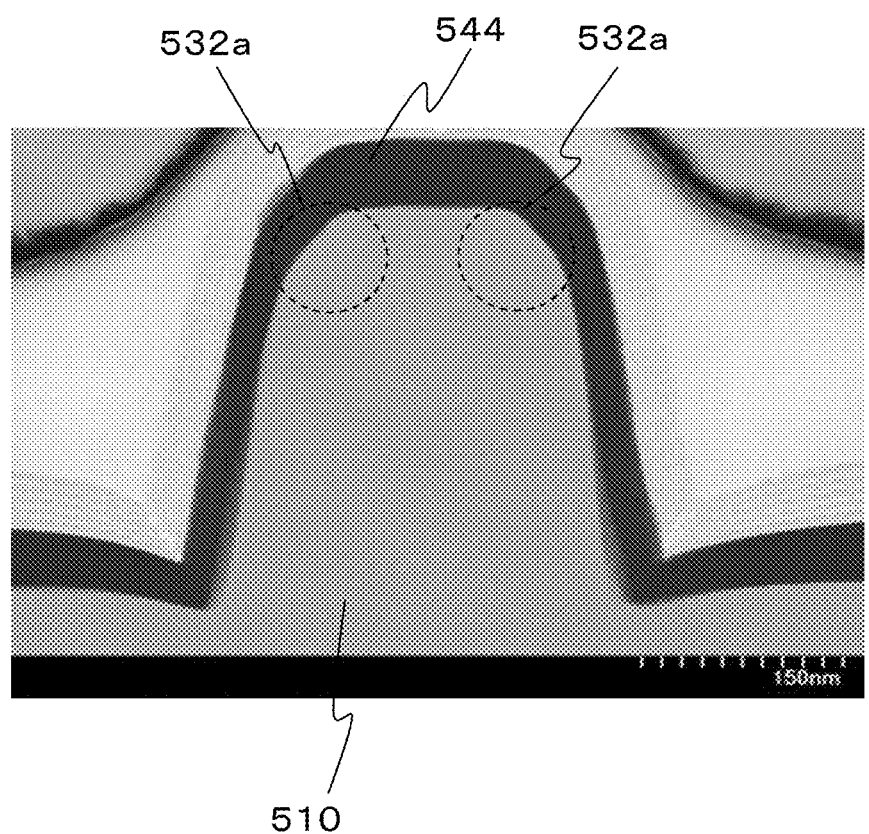
FIG. 12 is a STEM image of a sample manufactured in Example 2.

A cross section of the sample of this example obtained through the above steps was observed by STEM. FIG. 12 is a STEM image thereof.

FIG. 12 indicates that in the sample of this example, a region 532a having a curved surface was formed in an upper-end corner portion of a projecting portion of an insulating layer 510, and an oxide semiconductor layer 544 provided in contact with the insulating layer 510 was formed with good coverage. Thus, it is confirmed that a metal layer is used as a hard mask and the metal layer is etched, whereby a region having a curved surface can be provided in an upper-end corner portion of a projecting portion (which can also be referred to as an upper-end corner portion of a first region with a large thickness of an insulating layer). It is also confirmed that the oxide semiconductor layer provided in contact with the region having a curved surface can be formed with good coverage.

This application is based on Japanese Patent Application serial no. 2011-096162 filed with Japan Patent Office on Apr. 22, 2011, the entire contents of which are hereby incorporated by reference.

What is claimed is:

1. A method for manufacturing a semiconductor device comprising the steps of:
   forming an insulating layer;
   etching the insulating layer to form a first region with a first thickness and second regions with a second thickness smaller than the first thickness;
   processing an edge portion of the first region into a curved shape with rare gas plasma treatment;
   forming an oxide semiconductor layer over the insulating layer so as to be in contact with at least the first region having the curved shape;
   forming a source electrode and a drain electrode electrically connected to the oxide layer;
   forming a gate insulating layer over the oxide semiconductor layer; and
   forming a gate electrode over the gate insulating layer so that the gate electrode faces the side surfaces of the first region with the oxide semiconductor layer and the gate insulating layer interposed between the gate electrode and the side surfaces of the first region,
   wherein the first region is positioned between the second regions, and
   wherein the oxide semiconductor layer comprises indium, gallium, and zinc.

2. The method for manufacturing a semiconductor device according to claim 1, wherein the oxide semiconductor layer includes a crystal whose c-axis changes with the curved shape of the first region so that a direction of the c-axis is a direction parallel to a normal vector of the curved shape of the first region.

3. The method for manufacturing a semiconductor device according to claim 1,
   wherein the oxide semiconductor layer includes a crystal having a c-axis parallel to a normal vector of each of a side surface of the first region and top surfaces of the second regions.

4. A method for manufacturing a semiconductor device comprising the steps of:
   forming an insulating layer;
   etching the insulating layer to form a first region with a first thickness and second regions with a second thickness smaller than the first thickness;
   processing an edge portion of the first region into a curved shape with rare gas plasma treatment;
   forming an oxide semiconductor layer in contact with a top surface, side surfaces, and the edge portion with the curved shape of the first region and parts of the second regions;
   forming a source electrode and a drain electrode electrically connected to the oxide semiconductor layer;
   forming a gate insulating layer over the oxide semiconductor layer; and
   forming a gate electrode over the gate insulating layer so that the gate electrode faces the side surfaces of the first region with the oxide semiconductor layer and the gate insulating layer interposed between the gate electrode and the side surfaces of the first region,
   wherein the first region is positioned between the second regions, and
   wherein the oxide semiconductor layer comprises indium, gallium, and zinc.

5. The method for manufacturing a semiconductor device according to claim 4, wherein the oxide semiconductor layer includes a crystal whose c-axis changes with the curved shape of the first region so that a direction of the c-axis is a direction parallel to a normal vector of the curved shape of the first region.

6. The method for manufacturing a semiconductor device according to claim 4, wherein the oxide semiconductor layer includes a crystal having a c-axis parallel to a normal vector of each of a side surface of the first region and top surfaces of the second regions.

7. A method for manufacturing a semiconductor device comprising the steps of:
   forming an insulating layer;
   forming a metal layer over the insulating layer;
   forming a resist mask over the metal layer;
   patterning the metal layer with the resist mask;
   removing the resist mask after patterning the metal layer;
   etching the insulating layer with the patterned metal layer used as a mask to form a first region with a first thickness and second regions with a second thickness smaller than the first thickness, the first region being below the patterned metal layer;
   removing the patterned metal layer and processing an edge portion of the first region into a curved shape, by dry etching on the patterned metal layer with one or both of a gas containing fluorine and a gas containing chlorine;
   forming an oxide semiconductor layer in contact with a top surface, side surfaces, and the edge portion with the curved shape of the first region and parts of the second regions;
   forming a source electrode and a drain electrode electrically connected to the oxide semiconductor layer;
   forming a gate insulating layer over the oxide semiconductor layer; and
   forming a gate electrode over the gate insulating layer so that the gate electrode faces the side surfaces of the first region with the oxide semiconductor layer and the gate insulating layer interposed between the gate electrode and the side surfaces of the first region,
   wherein the first region is positioned between the second regions, and
   wherein the oxide semiconductor layer comprises indium, gallium, and zinc.

8. The method for manufacturing a semiconductor device according to claim 7, wherein the oxide semiconductor layer includes a crystal whose c-axis changes with the curved shape of the first region so that a direction of the c-axis is a direction parallel to a normal vector of the curved shape of the first region.

9. The method for manufacturing a semiconductor device according to claim 7, wherein the oxide semiconductor layer includes a crystal having a c-axis parallel to a normal vector of each of a side surface of the first region and top surfaces of the second regions.

10. A method for manufacturing a semiconductor device comprising the steps of:
forming an insulating layer;
forming a resist mask over the insulating layer;
performing heat treatment on the resist mask to obtain a resist mask having a curved surface;
etching the insulating layer with the resist mask having the curved surface to form a first region with a first thickness and second regions with a second thickness smaller than the first thickness, the first region being below the resist mask having the curved surface and having an edge portion processed into a curved shape;
forming an oxide semiconductor layer in contact with a top surface, side surfaces, and the edge portion with the curved shape of the first region and parts of the second regions;
forming a source electrode and a drain electrode electrically connected to the oxide semiconductor layer;
forming a gate insulating layer over the oxide semiconductor layer; and
forming a gate electrode over the gate insulating layer so that the gate electrode faces the side surfaces of the first region with the oxide semiconductor layer and the gate insulating layer interposed between the gate electrode and the side surfaces of the first region,
wherein the first region is positioned between the second regions, and
wherein the oxide semiconductor layer comprises indium, gallium, and zinc.

11. The method for manufacturing a semiconductor device according to claim 10, wherein the oxide semiconductor layer includes a crystal whose c-axis changes with the curved shape so that a direction of the c-axis is a direction parallel to a normal vector of the curved shape.

12. The method for manufacturing a semiconductor device according to claim 10, wherein the oxide semiconductor layer includes a crystal having a c-axis parallel to a normal vector of each of a side surface of the first region and top surfaces of the second regions.

13. The method for manufacturing a semiconductor device according to claim 1, wherein the curved shape has a radius of curvature of greater than or equal to 20 nm and less than or equal to 60 nm.

14. The method for manufacturing a semiconductor device according to claim 4, wherein the curved shape has a radius of curvature of greater than or equal to 20 nm and less than or equal to 60 nm.

15. The method for manufacturing a semiconductor device according to claim 7, wherein the curved shape has a radius of curvature of greater than or equal to 20 nm and less than or equal to 60 nm.

16. The method for manufacturing a semiconductor device according to claim 10, the curved shape has a radius of curvature of greater than or equal to 20 nm and less than or equal to 60 nm.

* * * * *

UNITED STATES PATENT AND TRADEMARK OFFICE
CERTIFICATE OF CORRECTION

PATENT NO. : 8,932,913 B2
APPLICATION NO. : 13/446022
DATED : January 13, 2015
INVENTOR(S) : Shinya Sasagawa et al.

It is certified that error appears in the above-identified patent and that said Letters Patent is hereby corrected as shown below:

In the Specification

At column 25, line 11, "nm" should be --nm.--;

At column 26, line 35, "(CO," should be --(Cl),--;

In the Claims

In claim 1, at column 27, line 38, "oxide layer;" should be --oxide semiconductor layer;--.

Signed and Sealed this
Seventh Day of July, 2015

Michelle K. Lee
*Director of the United States Patent and Trademark Office*